(12) United States Patent
Munetaka et al.

(10) Patent No.: US 10,804,390 B2
(45) Date of Patent: Oct. 13, 2020

(54) SEMICONDUCTOR DEVICE WITH SILICON PILLAR HAVING A DEVICE ISOLATION FILM CONTACTING A SURFACE THEREOF

(71) Applicant: Micron Technology, Inc., Boise, ID (US)

(72) Inventors: Yuki Munetaka, Tokyo (JP); Kazuo Ogawa, Tokyo (JP)

(73) Assignee: Micron Technology, Inc., Boise, ID (US)

(*) Notice: Subject to any disclaimer, the term of this patent is extended or adjusted under 35 U.S.C. 154(b) by 13 days.

(21) Appl. No.: 14/462,735

(22) Filed: Aug. 19, 2014

(65) Prior Publication Data

US 2015/0069502 A1    Mar. 12, 2015

(30) Foreign Application Priority Data

Sep. 6, 2013 (JP) .................................. 2013-184726

(51) Int. Cl.
| | |
|---|---|
| *H01L 29/78* | (2006.01) |
| *H01L 27/088* | (2006.01) |
| *H01L 29/423* | (2006.01) |
| *H01L 29/66* | (2006.01) |
| *H01L 21/8234* | (2006.01) |
| *H01L 29/06* | (2006.01) |

(52) U.S. Cl.
CPC .. *H01L 29/7827* (2013.01); *H01L 21/823487* (2013.01); *H01L 27/088* (2013.01); *H01L 29/4238* (2013.01); *H01L 29/42356* (2013.01); *H01L 29/66666* (2013.01); *H01L 29/0653* (2013.01)

(58) Field of Classification Search
None
See application file for complete search history.

(56) References Cited

U.S. PATENT DOCUMENTS

| | | | |
|---|---|---|---|
| 8,154,076 B2 | 4/2012 | Yoshihiro | |
| 8,357,577 B2* | 1/2013 | Munetaka | ......... H01L 29/42356 257/E21.41 |
| 8,378,417 B2* | 2/2013 | Ogawa | .............. H01L 29/66666 257/135 |
| 2008/0296677 A1* | 12/2008 | Takaishi | .............. H01L 29/7827 257/336 |

(Continued)

FOREIGN PATENT DOCUMENTS

JP    2009088134    4/2009

*Primary Examiner* — Bilkis Jahan
(74) *Attorney, Agent, or Firm* — Wells St. John P.S.

(57) ABSTRACT

A semiconductor device includes an active region which is surrounded by a device isolation region on a semiconductor substrate and which extends in a first direction; a silicon pillar which separates the active region along the first direction into a first lower diffusion layer and a second lower diffusion layer; a first gate electrode covering a first side face of the silicon pillar which is located on a side of the first lower diffusion layer; a second gate electrode covering a second side face of the silicon pillar which is located on a side of the second lower diffusion layer; a conductive layer provided on a top face of the silicon pillar; and a device isolation insulating film contacting with a third side face of the silicon pillar which is different from the first side face and the second side face.

19 Claims, 14 Drawing Sheets

(56) References Cited

U.S. PATENT DOCUMENTS

| | | | |
|---|---|---|---|
| 2011/0108910 A1* | 5/2011 | Kosuge | H01L 29/66666 257/329 |
| 2012/0049261 A1* | 3/2012 | Fujimoto | H01L 27/10808 257/300 |
| 2012/0080742 A1* | 4/2012 | Fujimoto | G11C 11/404 257/329 |
| 2013/0134507 A1* | 5/2013 | Takaishi | H01L 29/7827 257/334 |
| 2013/0161738 A1* | 6/2013 | Takaishi | H01L 29/7813 257/334 |
| 2013/0256788 A1* | 10/2013 | Kosuge | H01L 29/7827 257/330 |
| 2014/0015035 A1* | 1/2014 | Takaishi | H01L 29/7827 257/329 |

* cited by examiner

US 10,804,390 B2

SEMICONDUCTOR DEVICE WITH SILICON PILLAR HAVING A DEVICE ISOLATION FILM CONTACTING A SURFACE THEREOF

This application is based upon and claims the benefit of priority from Japanese patent application No. 2013-184726, filed on Sep. 6, 2013, the disclosure of which is incorporated herein in its entirety by reference.

TECHNICAL FIELD

This invention relates to a semiconductor device.

BACKGROUND

In recent years, vertical transistors have been proposed as a technology for miniaturization of transistors. Vertical transistors are transistors that use as a channel a semiconductor pillar which extends in a direction perpendicular to the principal surface of a semiconductor substrate. Specifically, vertical transistors are provided with a semiconductor pillar (base pillar) which rises from a semiconductor substrate, and a gate electrode is formed on a side face of the semiconductor pillar with a gate insulating film interposed between the pillar and the electrode.

One of a source region and a drain region is formed below the semiconductor pillar, and the other of the source region and the drain region is formed above the semiconductor pillar. Compared to related-art planar transistors where a channel is arranged parallel to the substrate, vertical transistors take up a smaller area, and do not take up an increased area when the channel length (gate length) is increased. Vertical transistors can therefore prevent the short channel effect without taking up more area.

Another advantage of vertical transistors is that the channel can be depleted completely, which means that a favorable subthreshold swing value (S value) and a large drain current can be obtained. In addition, with vertical transistors where the gate electrode is formed along the entire circumference of the channel, the electric potential of the channel can be controlled effectively via the gate electrode without being affected by external factors except the source and the drain.

A semiconductor device that uses a vertical transistor having such properties may include, in order to acquire high withstand voltage characteristics by extending the gate length, serial transistors which are created by forming a plurality of semiconductor pillars, forming an upper diffusion layer and a lower diffusion layer in each of the plurality of semiconductor pillars, and connecting the upper diffusion layer of one semiconductor pillar and the lower diffusion layer of another semiconductor pillar in series.

For instance, Japanese Unexamined Patent Application Publication (JP-A) No. 2009-88134 discloses, in FIGS. 1 and 2, a serial transistor configuration example in which a vertical transistor is disposed in each of an active region A and an active region B which are adjacent to each other with a device isolation region 2 sandwiched between the active regions, and an upper layer wiring disposed so as to extend across the intervening device isolation region connects the vertical transistors in series.

In a semiconductor device that includes the serial transistor described in Japanese Unexamined Patent Application Publication (JP-A) No. 2009-88134, the vertical transistor disposed in each active region is constructed from a pillar pair in which a silicon pillar 5 constructing the vertical transistor is paired with a dummy pillar 6 for supplying power to a gate electrode. The semiconductor apparatus also needs the device isolation region 2 for isolating the active regions from each other.

SUMMARY

In one embodiment, there is provided a semiconductor device, comprising:

an active region which is surrounded by a device isolation region on a semiconductor substrate and which extends in a first direction;

a silicon pillar which separates the active region along the first direction into a first lower diffusion layer and a second lower diffusion layer;

a first gate electrode covering a first side face of the silicon pillar which is located on a side of the first lower diffusion layer;

a second gate electrode covering a second side face of the silicon pillar which is located on a side of the second lower diffusion layer;

a conductive layer provided on a top face of the silicon pillar; and a device isolation insulating film contacting with a third side face of the silicon pillar which is different from the first side face and the second side face.

In another embodiment, there is provided a semiconductor device, comprising:

an active region which is surrounded by a device isolation region on a semiconductor substrate and which extends in a first direction;

a first silicon pillar and a second silicon pillar which separate the active region along the first direction into a first lower diffusion layer, a second lower diffusion layer, and a third lower diffusion layer;

a first gate electrode covering a first side face of the first silicon pillar which is located on a side of the first lower diffusion layer;

a second gate electrode covering a second side face of the first silicon pillar which is located on a side of the second lower diffusion layer;

a first conductive layer provided on a top face of the first silicon pillar;

a third gate electrode covering a third side face of the second silicon pillar which is located on a side the second lower diffusion layer;

a fourth gate electrode covering a fourth side face of the second silicon pillar which is located on a side of the third lower diffusion layer;

a second conductive layer provided on a top face of the second silicon pillar;

a first device isolation insulating film contacting with a fifth side face of the first silicon pillar which is different from the first side face and the second side face; and a second device isolation insulating film contacting with a sixth side face of the second silicon pillar which is different from the third side face and the fourth side face.

In the other embodiment, there is provided a semiconductor device, comprising:

a silicon pillar which stands on a semiconductor substrate;

a first lower diffusion layer and a second lower diffusion layer provided on the semiconductor substrate, a lower portion of the silicon pillar being sandwiched by the first diffusion layer and the second diffusion layer in a first direction;

a first device isolation insulating film and a second device isolation insulating film which are provided to contact with each end of the silicon pillar in a second direction, respectively, the second direction being a different direction from the first direction;

an upper diffusion layer provided at a top of the silicon pillar;

a gate insulating film provided on side faces of the silicon pillar; and a gate electrode which surrounds the silicon pillar via the first device isolation insulating film, the second device isolation insulating film and the gate insulating film.

DESCRIPTION OF EXEMPLARY EMBODIMENTS

Figure 1:
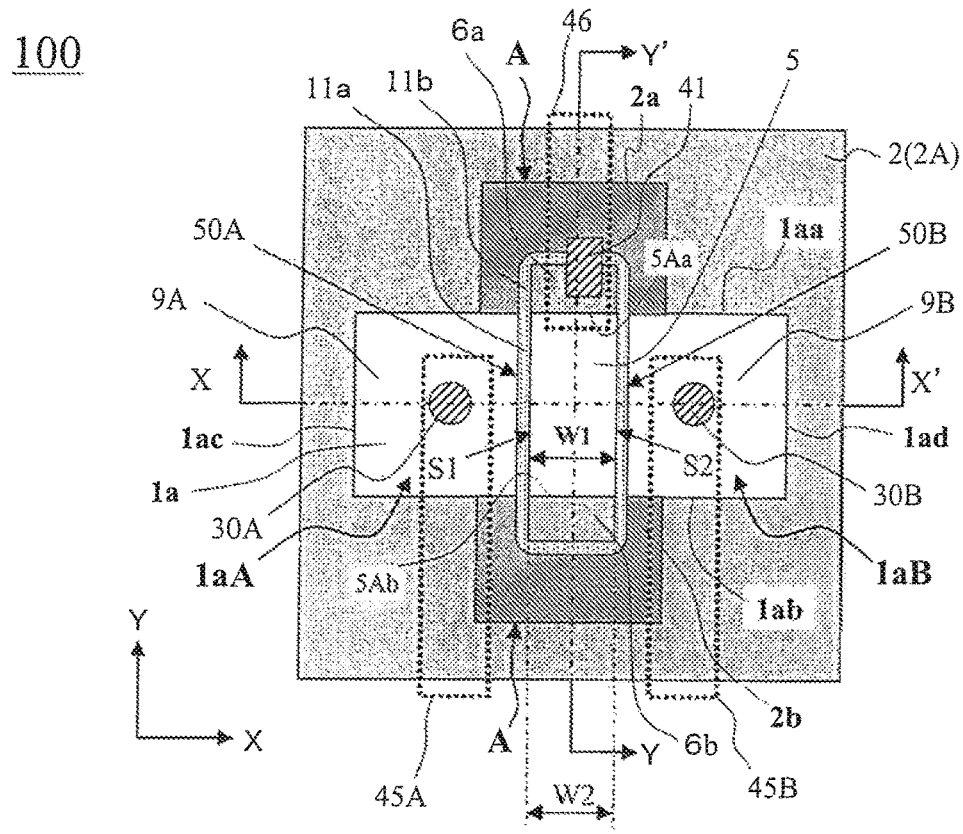
FIG. 1 is a schematic view (plan view) illustrating the structure of a semiconductor device 100 according to a first exemplary embodiment of this invention.

The present invention will be now described herein with reference to illustrative exemplary embodiments. Those skilled in the art will recognize that many alternative embodiments can be accomplished using the teachings of the present invention and that the invention is not limited to the exemplary embodiments illustrated for explanatory purposes.

Exemplary embodiments of the invention will be described in detail with reference to the drawings.

First Exemplary Embodiment

The schematic configuration of a semiconductor device 100 according to a first exemplary embodiment of this invention is described with reference to FIGS. 1 to 4. In the following description, the understanding of each component is made easier by setting the scale, number, and the like of the component in the drawings different from those in the actual structure. An X-Y-Z coordinate system is set in each drawing, where a direction Z is a direction perpendicular to the principal surface of a silicon substrate, a direction X is a direction orthogonal to the direction Z on a plane horizontal to the principal surface of the silicon substrate, and a direction Y is a direction orthogonal to the direction X on the plane horizontal to the principal surface of the silicon substrate. The direction X, the direction Y, and the direction Z may be referred to as "first direction", "second direction", and "third direction", respectively, in the following description.

Reference is made to the plan view of FIG. 1 first. The semiconductor device 100 according to the first exemplary embodiment has, on a semiconductor substrate 1 made of monocrystalline silicon (hereinafter referred to as silicon substrate 1), a device isolation region 2 (shallow trench isolation (STI) region 2), which is made from a device isolation insulating film 2A, and an active region 1a, which is a portion of the silicon substrate that is surrounded by the STI region 2. The active region 1a is marked out by a first end 1aa and a second end 1ab, which are opposed to each other in the direction Y, and a third end 1ac and a fourth end 1ad, which are opposed to each other in the direction X. The active region 1a includes a first active region 1aA and a second active region 1aB, which are adjacent to each other in the direction X, and a silicon pillar 5, which is interposed between the first active region 1aA and the second active region 1aB.

The silicon pillar 5 is disposed so as to extend along the entire length from the first end 1aa to the second end 1ab. The first active region 1aA and the second active region 1aB are accordingly separated from each other by the silicon pillar 5. The silicon pillar 5 has a first pillar side face S1 and a second pillar side face S2, which are opposed to each other in the direction X, and a third pillar side face 5Aa and a fourth pillar side face 5Ab, which are opposed to each other in the direction Y.

A first transistor 50A is disposed on the first pillar side face S1, and a second transistor 50B is disposed on the second pillar side face S2. The first active region 1aA adjoining the first transistor 50A is constructed from a first lower diffusion layer 9A, and a first plug 30A which serves as a contact plug is disposed therein. Similarly, the second active region 1aB adjoining the second transistor 50B is constructed from a second lower diffusion layer 9B, and a second plug 30B is disposed therein. A first wiring 45A extending in the direction Y is arranged so as to overlap with a region where the first plug 30A is disposed, and a second wiring 45B extending in the Y direction is arranged so as to overlap with a region where the second plug 30B is disposed.

A pillar trench forming region A for forming the silicon pillar 5 is constructed as a cross-shaped region by the active region 1a and a portion of the STI region 2 that is adjacent to the active region 1a. Specifically, a rectangular first STI region 2a which adjoins the first end 1aa of the active region 1a and a rectangular second STI region 2b which adjoins the second end 1ab are combined to the active region 1a to form a cross shape in plan view, which constructs the pillar trench forming region A.

A first dummy pillar 6a which adjoins the third pillar side face 5Aa and which is made from the device isolation insulating film 2A is disposed in the first STI region 2a. The center line in the direction X of the first dummy pillar 6a coincides with the center line in the direction X of the silicon pillar 5. It is preferred for a width W2 in the direction X of the first dummy pillar 6a to be equal to a width W1 in the direction X of the silicon pillar 5. The width W1 in this embodiment is 45 nm, for example. According to a manufacturing method described later, the width W2 in the direction X of the first dummy pillar 6a is narrower than the width W1 in the direction X of the silicon pillar 5. Also in this case, the first dummy pillar 6a is disposed so that the decrease of W2 from W1 is within a range of from 0 to 4 W1/5. The narrowing of W2 means an increase of an exposed portion of the third pillar side face 5Aa.

Disposing a gate electrode on the third pillar side face 5Aa, which is orthogonal to the first pillar side face S1 and to the second pillar side face S2 unwantedly induces a channel on the third pillar side face 5Aa as well, thereby increasing the risk of short circuit between the first transistor 50A and the second transistor 50B. A second dummy pillar 6b which adjoins the second end 1ab is similarly disposed in the second STI region 2b. In order to avoid inducing a channel on the third pillar side face 5Aa and the fourth pillar side face 5Ab as described above, the width in the direction Y of the first dummy pillar 6a and the second dummy pillar 6b is set to a value that is at least greater than the thickness of a gate insulating film described later, for example, 10 nm or more.

The first dummy pillar 6a and the second dummy pillar 6b which are made from the device isolation insulating film 2A are respectively connected to one end and the other end of the silicon pillar 5 to construct a unitary composite pillar. A gate electrode wiring 11 which has a thickness of 5 nm in a planar direction is disposed on side faces along the entire circumference of the composite pillar. The gate electrode wiring 11 includes a transistor-use gate electrode (hereinafter simply referred to as gate electrode) 11a, which is disposed on the first pillar side face S1 and the second pillar side face S2 with a gate insulating film interposed between the pillar side faces and the gate electrode, and a dummy gate electrode 11b, which is disposed so as to adjoin side faces of the dummy pillars 6a and 6b. The dummy gate electrode 11b functions as a wiring for supplying power to the gate electrode 11a. The dummy pillars 6 accordingly function as gate power supply pillars.

On a side face of the first dummy pillar 6a that is opposed to the third pillar side face 5Aa, a third plug 41 which has a rectangular shape in plan view is disposed so as to partially overlap with the dummy gate electrode 11b and the dummy pillar 6a. The third plug 41 serves as a contact plug for supplying power to the dummy gate electrode 11b. The third plug 41, which is disposed on the first dummy pillar 6a side in FIG. 1, may instead be disposed on the second dummy pillar 6b side. A third wiring 46 extending in the direction Y is arranged so as to overlap with a region where the third plug 41 is disposed. The silicon pillar 5, the first pillar side face S1, the gate electrode 11a, which is disposed with the gate insulating film interposed, and the first lower diffusion layer 9A construct the first transistor 50A. The silicon pillar 5, the second pillar side face S2, the gate electrode 11a, which is disposed with the gate insulating film interposed, and the second lower diffusion layer 9B construct the second transistor 50B.

Figure 2:
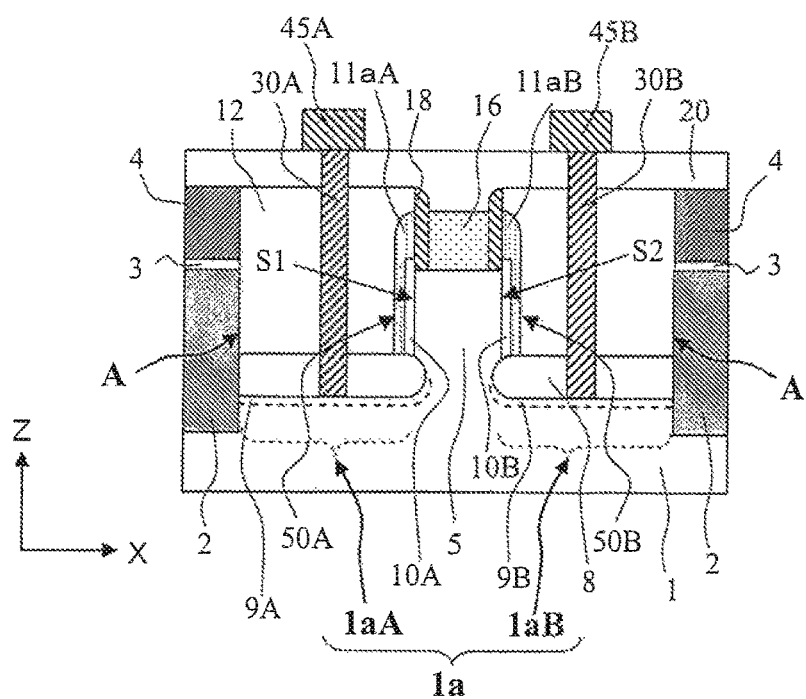
FIG. 2 is a sectional view taken along the line X-X' of FIG. 1.

Reference is made to a sectional view of FIG. 2 next. FIG. 2 is a sectional view taken along the line X-X' of FIG. 1.

The silicon substrate 1 is provided with the STI region 2, and the silicon pillar 5 which is a semiconductor base pillar (semiconductor pillar) stands in the active region 1a which is a portion of the silicon substrate 1 that is surrounded by the STI region 2. The silicon pillar 5 has the first pillar side face S1 and the second pillar side face S2 which are opposed to each other in the direction X. The first transistor 50A is disposed on the first pillar side face S1, and the second transistor 50B is disposed on the second pillar side face S2. In the first transistor 50A, the gate electrode 11a is formed on one of side faces in the direction X of the silicon pillar 5 with a gate insulating film 10 interposed between the gate electrode 11a and the pillar side face. To give a more detailed description, a first gate electrode 11aA is formed on the first pillar side face S1 of the silicon pillar 5 with a first gate insulating film 10A interposed between the first gate electrode 11aA and the first pillar side face S1. A second gate electrode 11aB is similarly formed on the second pillar side face S2 with a second gate insulating film 10B interposed between the second gate electrode 11aB and the second pillar side face S2. The first gate insulating film 10A and the second gate insulating film 10B, which have the same thickness, are sometimes collectively referred to as gate insulating films 10.

Figure 3:
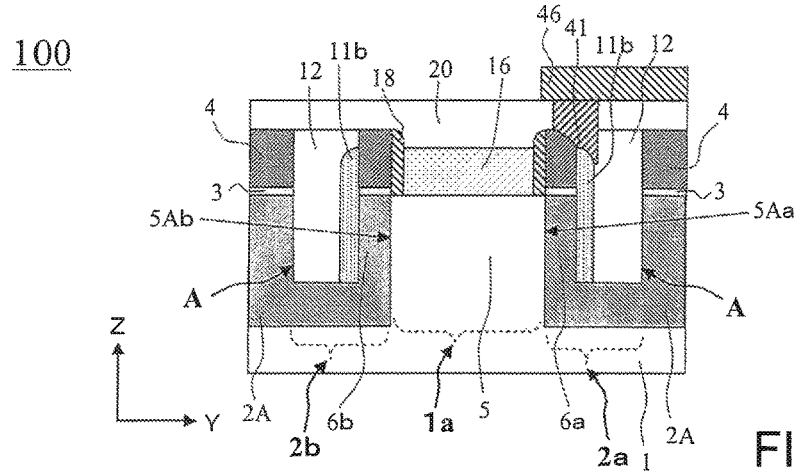
FIG. 3 is a sectional view taken along the line Y-Y of FIG. 1.

Reference is made to a sectional view of FIG. 3 next. FIG. 3 is a sectional view taken along the line Y-Y' of FIG. 1.

The first dummy pillar 6a is disposed so as to be adjacent to the third pillar side face 5Aa, which marks out the silicon pillar 5 in the direction Y, and the second dummy pillar 6b is disposed so as to adjoin the fourth pillar side face 5Ab. The first dummy pillar 6a and the second dummy pillar 6b are disposed in the first STI region 2a and the second STI region 2b, respectively, and are both constructed from the device isolation insulating film 2A. In other words, the dummy pillars 6 are pillar-shaped insulators protruding from a surface of the STI region 2, and one of insulator side faces in the direction Y constructs a composite pillar which is unitary with the silicon pillar 5.

The third plug 41 which has a rectangular shape in plan view is disposed above the first dummy pillar 6a. The third plug 41 is formed so as to pierce a second interlayer insulating film 20, which covers a space above the dummy pillars 6, and is connected to the third wiring 46, which is formed on a top face of the second interlayer insulating film 20. The dummy gate electrode 11B is formed on a side face of each of the two dummy pillars 6. The dummy gate electrode 11b is unitary with the gate electrode 11a in border portions where the silicon pillar 5 borders the dummy pillars 6. A portion of the third plug 41 that extends beyond the dummy pillar 6a is connected to the dummy gate electrode 11b.

Referring back to FIG. 2, the first transistor 50A has a conductive layer 16, which is located on a top face of the silicon pillar 5 and which forms one of a source and a drain, and the first lower diffusion layer 9A, which is located below the silicon pillar 5 and which forms the other of the source and the drain. Similarly, the second transistor 50B has the conductive layer 16, which is located on the top face of the silicon pillar 5 and which forms one of a source and a drain, and the second lower diffusion layer 9B, which is located below the silicon pillar 5 and which forms the other of the source and the drain. The conductive layer 16 is shared by the first transistor 50A and the second transistor 50B.

The first lower diffusion layer 9A is placed below the first pillar side face S1 and the second lower diffusion layer 9B is placed below the second pillar side face S2, whereas the conductive layer 16 is placed above the first pillar side face S1 and the second pillar side face S2. A surface of the silicon pillar 5 that includes the first pillar side face S1 disposed between the conductive layer 16 and the first lower diffusion layer 9A constructs a first channel region of the first transistor 50A. A surface of the silicon pillar 5 that includes the second pillar side face S2 disposed between the conductive layer 16 and the second lower diffusion layer 9B constructs a second channel region of the second transistor 50B.

As described above, the first transistor 50A includes the first lower diffusion layer 9A located below the first pillar side face S1 of the silicon pillar 5, a portion of the conductive layer 16 that is located above the first pillar side face S1, the first gate insulating film 10A covering the first pillar side face S1, the first gate electrode 11aA covering the first gate insulating film 10A, and the channel region located on a surface of the silicon pillar 5 that constructs the first pillar side face S1. The second transistor 50B includes the second lower diffusion layer 9B in the second active region 1aB located below the second pillar side face S2 of the silicon pillar 5, a portion of the conductive layer 16 that is located above the second pillar side face S2, the second gate insulating film 10B covering the second pillar side face S2, the second gate electrode 11aB covering the second gate insulating film 10B, and the channel region located on a surface of the silicon pillar 5 that constructs the second pillar side face S2. Because the conductive layer 16 is shared by the first transistor 50A and the second transistor 50B in this manner, the first transistor 50A and the second transistor 50B are connected in series by the conductive layer 16.

An insulating film 8 is formed on a top face of the first active region 1aA and a top face of the second active region 1aB. The insulating film 8 extends from below the side faces of the silicon pillar 5 in the direction X to reach the STI region 2. The lower diffusion layers 9 are arranged so as to overlap with the insulating film 8 below the insulating film 8, and the insulating film 8 electrically insulates the lower diffusion layers 9 from the gate electrodes 11a. The STI region 2 is arranged so as to reach a deeper point than the lower diffusion layers 9 in order to prevent electrical connection between the lower diffusion layers 9 of two regions (one region illustrated in FIG. 2 and the other region (not shown)) that are adjacent to each other with the STI region 2 interposed therebetween.

Side faces of the conductive layer 16 which is formed on the top face of the silicon pillar 5 are covered with a side wall insulating film 18, and a top face of the side wall insulating film 18 is covered with the second interlayer insulating film 20. The channel regions of the transistors 50 and the conductive layer 16 are electrically insulated from the gate electrodes 11a by the gate insulating films 10 and the side wall insulating film 18. A first interlayer insulating film 12 is formed so as to cover the gate electrode wiring 11 and the insulating film 8, and fills up the interior of the pillar trench forming region A.

The first plug 30A which pierces the second interlayer insulating film 20, the first interlayer insulating film 12, and the insulating film 8 is connected to the first lower diffusion layer 9A in the first active region 1aA. The second plug 30B which pierces the second interlayer insulating film 20, the first interlayer insulating film 12, and the insulating film 8 is connected to the second lower diffusion layer 9B in the second active region 1aB. A first wiring 45A and a second wiring 45B are formed on a top face of the second interlayer insulating film 20. The first wiring 45A is connected to the first plug 30A, and the second wiring 45B is connected to the second plug 30B.

Figure 4:
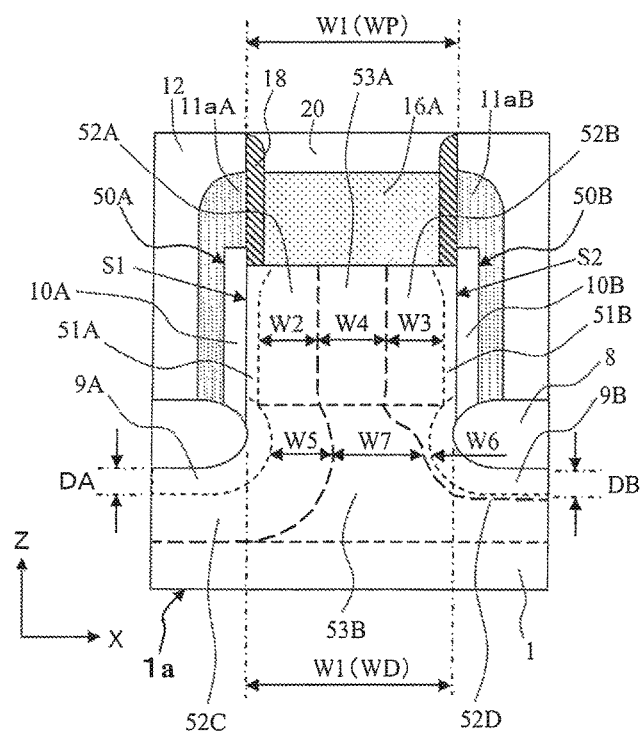
FIG. 4 is a sectional view that is an enlarged view of broken-line portions of FIG. 2.

Reference is made to a sectional view of FIG. 4 next. FIG. 4 is an enlarged sectional view of the first transistor 50A and the second transistor 50B in the silicon pillar 5 of FIG. 2. The conductive layer 16 shared by the first transistor 50A and the second transistor 50B is placed on the top face of the silicon pillar 5 to electrically connect the top of the first transistor 50A and the top of the second transistor 50B in series. The semiconductor apparatus 100 thus has two vertical transistors that are connected in series in one silicon pillar. In the active region 1a, the first lower diffusion layer 9A is placed below the first transistor 50A and the second lower diffusion layer 9B is placed below the second transistor 50B. A depth DA from the surface of the silicon substrate 1 in the first lower diffusion layer 9A is 5 nm, and a depth DB in the second lower diffusion layer 9B is 5 nm as well.

The following description is given on the assumption that the first transistor 50A and the second transistor 50B are turned on simultaneously, and that a + (plus) voltage is applied to the first lower diffusion layer 9A side whereas a − (minus) voltage is applied to the second lower diffusion layer 9B side. In the silicon pillar 5, the vicinity of the surface of the first pillar side face S1 is a first channel region 51A which constructs the first transistor 50A, and the vicinity of the surface of the second pillar side face S2 is a second channel region 51B which constructs the second transistor 50B.

In the interior of the silicon pillar 5, a first depletion layer 52A is generated next to the first channel region 51A, and a second depletion layer 52B is generated next to the second channel region 51B. A first neutral region 53A is generated between the first depletion layer 52A and the second depletion layer 52B to function as a buffer region for preventing short circuit between the first channel region 51A and the second channel region 51B at the top of the silicon pillar 5. Regions adjacent to the lower diffusion layers 9 also have depletion layers and a neutral region which are generated in the same state as the one described above.

Specifically, a third depletion layer 52C is generated next to the first lower diffusion layer 9A and a fourth depletion layer 52D is generated next to the second lower diffusion layer 9B. A second neutral region 53B is generated between the third depletion layer 52C and the fourth depletion layer 52D. The first depletion layer 52A and the third depletion layer 52C, which are treated as independent components for the convenience of description, are actually unitary with each other. Similarly, the second depletion layer 52B and the fourth depletion layer 52D are constructed as a unitary component. The first neutral region 53A and the second neutral region 53B are constructed as a unitary region as well.

The first depletion layer 52A and the second depletion layer 52B which are generated by the first gate electrode 11aA and the second gate electrode 11aB, respectively, have the same width because the same voltage is applied to the first gate electrode 11aA and the second gate electrode 11aB which are electrically unitary with the dummy gate electrodes. The width of the fourth depletion layer 52D which is generated by applying a minus voltage to the second lower diffusion layer 9B, however, becomes extremely narrow as the distance from the second depletion layer 52B increases, and therefore is narrower on the whole than the width of the third depletion layer 52C, which is generated by applying a plus voltage to the first lower diffusion layer 9A. To give an example in the semiconductor apparatus 100, a width W2 in the direction X of the first depletion layer 52A and a width W3 in the direction X of the second depletion layer 52B are both 15 nm, and a width W4 in the direction X of the first neutral region 53A, which is adjacent to the first and second depletion layers, is 15 nm. A width W5 of the third depletion layer 52C adjacent to the first lower diffusion layer 9A is similarly 15 nm, whereas a width W6 of the fourth depletion layer 52D adjacent to the second lower diffusion layer 9B is 1 nm or less. A width W7 of the second neutral region 53B, which is adjacent to the third and fourth depletion layers, is therefore about 19 nm. The minimum width in the direction X of each neutral region 53 which serves as a buffer region is thus regulated by the width W4 of the first neutral region 53A, which is narrower than the width W7 of the second neutral region 53B.

Accordingly, a width equal to or more than a prescribed value needs to be secured for the width W4 in order to prevent short circuit between the first transistor 50A and the second transistor 50B. Specifically, a sum of the width W2 of the first depletion layer 52A and the width W3 of the second depletion layer 52B which are determined in relation to supplied voltages is calculated first, and then a regulation value E1 (=W2+W3+W4) is calculated by adding to the sum the width W4 of the first neutral region 53A which is a minimum width necessary to keep a distance for avoiding short circuit between the first and second transistors. The width W1 of the silicon pillar 5 (this width is hereinafter denoted by WP) is set to a value larger than the regulation value E1. In the silicon pillar 5 that has a width set in this manner, depletion layers and neutral regions generated to have stable widths prevent short circuit between the first transistor and the second transistor, which allows the conductive layer 16 to connect two vertical transistors in series.

The semiconductor device 100 according to the first exemplary embodiment is thus configured so that two vertical transistors respectively formed on opposing side faces of one silicon pillar are isolated from each other in the interior of the silicon pillar, with a conductive layer formed on the top face of the silicon pillar. With this structure, the conductive layer connects the two vertical transistors in series, which eliminates the need for a device isolation region (STI region) that isolates two vertical transistors in the related art and a region where a wiring for connecting the two vertical transistors is laid out, and the area taken up by the semiconductor device 100 can accordingly be reduced.

Second Exemplary Embodiment

A semiconductor device 200 according to a second exemplary embodiment of this invention is described next with reference to FIG. 5 and FIG. 6. The second exemplary embodiment is a modification of the first exemplary embodiment in which one new silicon pillar is additionally placed in the same active region as that of an existing silicon pillar, next to the existing silicon pillar. In the second exemplary embodiment, components that have the same functions as those in the first embodiment are denoted by the same reference symbols in order to omit descriptions thereof and focus on differences from the first exemplary embodiment. A first silicon pillar 5A in the semiconductor device 200 is equivalent to the silicon pillar 5 in the semiconductor device 100. Similarly, a first conductive layer 16A is equivalent to the conductive layer 16.

Figure 5:
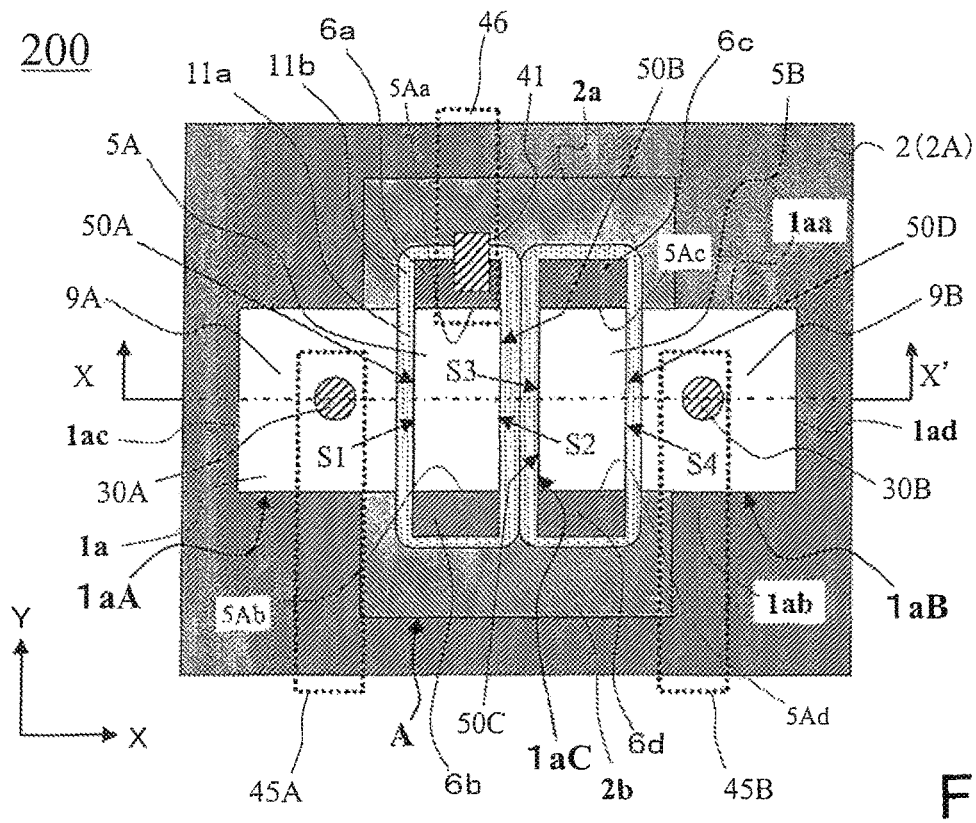
FIG. 5 is a schematic view (plan view) illustrating the structure of a semiconductor device 200 according to a second exemplary embodiment of this invention.

Reference is made to a plan view of FIG. 5 first. The semiconductor device 200 according to the second exemplary embodiment has, on the silicon substrate 1, the STI region 2, which is made from the device isolation insulating film 2A, and the active region 1a (1aA, 1aB, and 1aC), which is a portion of the silicon substrate that is surrounded by the STI region 2. The active region 1a includes the first active region 1aA, the second active region 1aB, and a third active region 1aC, which are adjacent to one another in the direction X, the first silicon pillar 5A, which is located between the first active region 1aA and the third active region 1aC, and a second silicon pillar 5B, which is located between the second active region 1aB and the third active region 1aC. The first silicon pillar 5A and the second silicon pillar 5B are both arranged so as to extend along the entire length from the first end 1aa to the second end 1ab.

Accordingly, the first active region 1aA and the third active region 1aC are separated from each other by the first silicon pillar 5A, and the second active region 1aB and the third active region 1aC are separated from each other by the second silicon pillar 5B. The first silicon pillar 5A made from the silicon substrate 1 is provided with the transistors 50, which are vertical transistors having the first pillar side face S1 and second pillar side face S2 opposed to each other in the direction X, and the third pillar side face 5Aa and fourth pillar side face 5Ab opposed to each other in the direction Y.

To give a more detailed description, the first transistor 50A is disposed on the first pillar side face S1, which is one of the side faces of the first silicon pillar 5A that are opposed to each other in the direction X, and the second transistor 50B is disposed on the second pillar side face S2, which is the other of the side faces of the first silicon pillar opposed in the direction X. The first active region 1aA adjoining the first transistor 50A is constructed from the first lower diffusion layer 9A, and the first plug 30A which serves as a contact plug is disposed therein. Similarly, a third lower diffusion layer 9C is disposed in the second transistor 50B. The second silicon pillar 5B is provided with other transistors 50, which are vertical transistors having a fifth pillar side face S3 and sixth pillar side face S4 opposed to each other in the direction X, and a seventh pillar side face 5Ac and eighth pillar side face 5Ad opposed to each other in the direction Y.

To give a more detailed description, a third transistor 50C is disposed on the fifth pillar side face S3, which is one of the side faces of the second silicon pillar 5B that are opposed to each other in the direction X, and a fourth transistor 50D is disposed on the sixth pillar side face S4, which is the other of the side faces of the second silicon pillar opposed in the direction X. The second active region 1aB adjoining the fourth transistor 50D is constructed from the second lower diffusion layer 9B, and the second plug 30B is disposed therein. The third lower diffusion layer 9C is disposed in the third transistor 50C.

Disposed in the first STI region 2a are the first dummy pillar 6a, which adjoins the third pillar side face 5Aa and which is made from the device isolation insulating film 2A, and a third dummy pillar 6c, which adjoins the seventh pillar side face 5Ac and which is made from the device isolation insulating film 2A. The center line in the direction X of the first dummy pillar 6a coincides with the center line in the direction X of the first silicon pillar 5A. The center line in the direction X of the third dummy pillar 6c coincides with the center line in the direction X of the second silicon pillar 5B. Similarly disposed in the second STI region 2b are the second dummy pillar 6b, which adjoins the fourth pillar side face 5Ab and a fourth dummy pillar 6d, which adjoins the eighth pillar side face 5Ad. The first dummy pillar 6a and the second dummy pillar 6b which are made from the device isolation insulating film 2A are respectively connected to one end and the other end of the first silicon pillar 5A to construct a composite pillar that is unitary with the side faces in the direction Y of the first silicon pillar 5A. Similarly, the third dummy pillar 6c and the fourth dummy pillar 6d are connected to the second silicon pillar 5B to construct a composite pillar that is unitary with the side faces in the direction Y of the second silicon pillar 5B.

The first silicon pillar 5A, the first pillar side face S1, the gate electrode 11a, which is disposed with a gate insulating film interposed, and the first lower diffusion layer 9A construct the first transistor 50A. The first silicon pillar 5A, the second pillar side face S2, the gate electrode 11a, which is disposed with a gate insulating film interposed, and the third lower diffusion layer 9C construct the second transistor 50B. Similarly, the second silicon pillar 5B, the fifth pillar side face S3, the gate electrode 11a, which is disposed with a gate insulating film interposed, and the third lower diffusion layer 9C construct the third transistor 50C. The second silicon pillar 5B, the sixth pillar side face S4, the gate electrode 11a, which is disposed with a gate insulating film interposed, and the second lower diffusion layer 9B construct the fourth transistor 50D.

Figure 6:
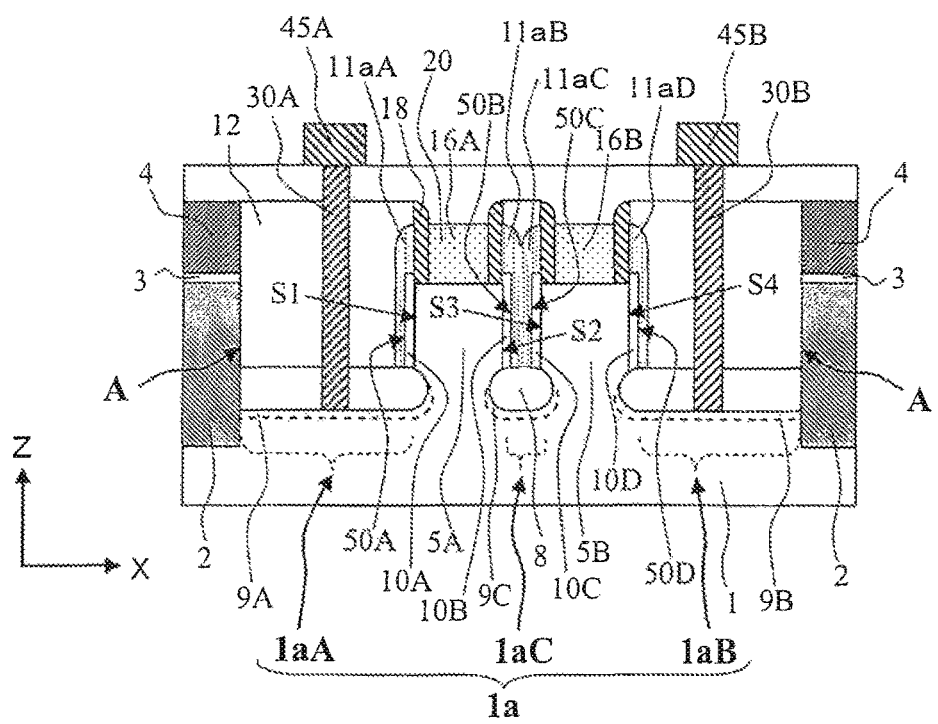
FIG. 6 is a sectional view taken along the line X-X' of FIG. 5.

Reference is made to FIG. 6 next. FIG. 6 is a sectional view taken along the line X-X' of FIG. 5. The first silicon pillar 5A and the second silicon pillar 5B stand in the active region 1a which is a portion of the silicon substrate 1 that is surrounded by the STI region 2. The second silicon pillar 5B has the fifth pillar side face S3 and the sixth pillar side face S4 which are opposed to each other in the direction X. The third transistor 50C is disposed on the fifth pillar side face S3, and the fourth transistor 50D is disposed on the sixth pillar side face S4. The first gate electrode 11aA is formed on the first pillar side face S1 of the first silicon pillar 5A with the first gate insulating film 10A interposed between the gate electrode and the pillar side face. Similarly, the second gate electrode 11aB is formed on the second pillar side face S2 with the second gate insulating film 10B interposed between the gate electrode and the pillar side face.

A third gate electrode 11aC is formed on the fifth pillar side face S3 of the second silicon pillar 5B with a third gate insulating film 10C interposed between the gate electrode and the pillar side face. Similarly, a fourth gate electrode 11aD is formed on the sixth pillar side face S4 with a fourth gate insulating film 10D interposed between the gate electrode and the pillar side face. A gap between the first silicon pillar 5A and the second silicon pillar 5B is twice the thickness of each gate electrode 11a or less, and the second gate electrode 11aB and the third gate electrode 11aC are therefore unitary with each other. With this configuration, each transistor is supplied with power by supplying power from the third plug 41 to the gate electrodes 11a of the second silicon pillar 5B via the dummy gate electrode 11b of the first dummy pillar 6a and the gate electrodes 11a of the first silicon pillar 5A.

The first transistor 50A has the first conductive layer 16A, which is located on a top face of the first silicon pillar 5A and which forms one of a source and a drain, and the first lower diffusion layer 9A, which is located below the first silicon pillar 5A and which forms the other of the source and the drain. Similarly, the second transistor 50B has the first conductive layer 16, which is located on the top face of the first silicon pillar 5A and which forms one of a source and a drain, and the third lower diffusion layer 9C, which is located below the first silicon pillar 5A and which forms the other of the source and the drain. The third transistor 50C has a second conductive layer 16B, which is located on a top face of the second silicon pillar 5B and which forms one of a source and a drain, and the third lower diffusion layer 9C, which is located below the second silicon pillar 5B and which forms the other of the source and the drain.

Similarly, the fourth transistor 50D has the second conductive layer 16B, which is located on the top face of the second silicon pillar 5B and which forms one of a source and a drain, and the second lower diffusion layer 9B, which is located below the second silicon pillar 5B and which forms the other of the source and the drain. The first conductive layer 16A is shared by the first transistor 50A and the second transistor 50B. The second conductive layer 16B is shared by the third transistor 50C and the fourth transistor 50D.

The first lower diffusion layer 9A is placed below the first pillar side face S1 and the second lower diffusion layer 9B is placed below the sixth pillar side face S4, whereas the third lower diffusion layer 9C is placed below the second pillar side face S2 and the fifth pillar side face S3. The first conductive layer 16A is placed above the first pillar side face S1 and the second pillar side face S2, and the second conductive layer 16B is placed above the fifth pillar side face S3 and the sixth pillar side face S4. A surface of the first silicon pillar 5A that includes the first pillar side face S1 disposed between the first conductive layer 16A and the first lower diffusion layer 9A constructs a first channel region of the first transistor 50A. A surface of the first silicon pillar 5A that includes the second pillar side face S2 disposed between the first conductive layer 16A and the third lower diffusion layer 9C constructs a second channel region of the second transistor 50B. A surface of the second silicon pillar 5B that includes the fifth pillar side face S3 disposed between the second conductive layer 16B and the third lower diffusion layer 9C constructs a third channel region of the third transistor 50C.

A surface of the second silicon pillar 5B that includes the sixth pillar side face S4 disposed between the second conductive layer 16B and the second lower diffusion layer 9B constructs a fourth channel region of the fourth transistor 50D. To give a more detailed description, the vicinity of the surface of the fifth pillar side face S3 in the direction X is the third channel region of the third transistor 50C, and the vicinity of the surface of the sixth pillar side face S4 is the fourth channel region of the fourth transistor 50D. As described above, the first transistor 50A includes the first lower diffusion layer 9A in the first active region 1aA located below the first pillar side face S1 of the first silicon pillar 5A, the first conductive layer 16A located above the first pillar side face S1, the first gate insulating film 10A covering the first pillar side face S1, the first gate electrode 11aA covering the first gate insulating film 10A, and the first channel region located on a surface of the first silicon pillar 5A that constructs the first pillar side face s1.

The second transistor 50B includes the third lower diffusion layer 9C in the third active region 1aC located below the second pillar side face S2 of the first silicon pillar 5A, the first conductive layer 16A located above the second pillar side face S2, the second gate insulating film 10B covering the second pillar side face S2, the second gate electrode 11aB covering the second gate insulating film 10B, and the second channel region located on a surface of the first silicon pillar 5A that constructs the second pillar side face S2. Thus, the first conductive layer 16A is shared by the first transistor 50A and the second transistor 50B, and the second conductive layer 16B is shared by the third transistor 50C and the fourth transistor 50D. In addition, the third lower diffusion layer 9C is shared by the second transistor 50B and the third transistor 50C. The first transistor 50A, the second transistor 50B, the third transistor 50C, and the fourth transistor 50D are accordingly connected in series by the first conductive layer 16A, the second conductive layer 16B, and the third lower diffusion layer 9C. The insulating film 8 is formed on the top face of the first active region 1aA, the top face of the second active region 1aB, and a top face of the third active region 1aC. The insulating film 8 reaches the STI region 2 from below the side faces of the silicon pillars 5.

The semiconductor device 200 according to the second exemplary embodiment can thus reduce the area taken up by the semiconductor device 200 as with the semiconductor device 100 according to the first exemplary embodiment. The semiconductor device 200 according to the second exemplary embodiment, where the third lower diffusion layer 9C connects in series the second transistor 50B and the third transistor 50C which are formed in two different silicon pillars, also has an advantage over the semiconductor device 100. Connecting two semiconductor device 100 in order to build a semiconductor device in which four vertical transistors are connected in series requires the STI region 2 between one semiconductor apparatus 100 and the other semiconductor device 100, whereas the configuration of the semiconductor device 200 does not require this STI region 2. The area taken up when two semiconductor device 200 are connected is therefore smaller than the area taken up when two semiconductor device 100 are connected.

Third Exemplary Embodiment

A semiconductor device 300 according to a third exemplary embodiment of this invention is described next with reference to FIG. 7 and FIG. 8. The third exemplary embodiment is a modification of the first exemplary embodiment in which two new silicon pillars are additionally placed in the positions where the first plug and the second plug are disposed. In the third exemplary embodiment, components that have the same functions as those in the first embodiment are denoted by the same reference symbols in order to omit descriptions thereof and focus on differences from the first exemplary embodiment. A first silicon pillar 5A in the semiconductor device 300 is equivalent to the silicon pillar 5 in the semiconductor device 100. Similarly, a first conductive layer 16A is equivalent to the conductive layer 16.

Figure 7:
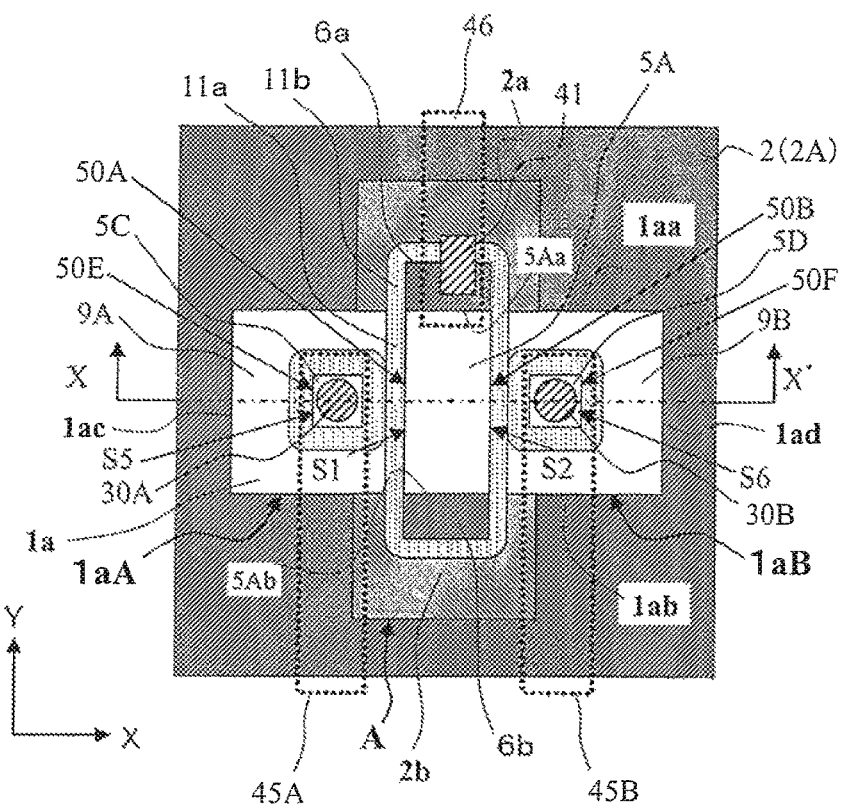
FIG. 7 is a schematic view (plan view) illustrating the structure of a semiconductor device 300 according to a third exemplary embodiment of this invention.

Reference is made to a plan view of FIG. 7 first. The active region 1a includes the first active region 1aA and the second active region 1aB, which are adjacent to each other in the direction X, the first silicon pillar 5A, which is located between the first active region 1aA and the second active region 1aB, a second silicon pillar 5C, which is surrounded by the first active region 1aA, and a third silicon pillar 5D, which is surrounded by the second active region 1aB. A third transistor 50E is disposed on a fifth pillar side face S5, which is the entirety of side faces of the second silicon pillar 5C. A fourth transistor 50F is disposed on a sixth pillar side face S6, which is the entirety of side faces of the third silicon pillar 5D. The first active region 1aA adjoining the first transistor 50A and the third transistor 50E is constructed from the first lower diffusion layer 9A, and the first plug 30A which serves as a contact plug is disposed on a top face of the third transistor 50E.

Similarly, the second active region 1aB adjoining the second transistor 50B and the fourth transistor 50F is constructed from the second lower diffusion layer 9B, and the second plug 30B is disposed on a top face of the fourth transistor 50F. The gate electrodes 11a having a thickness of 5 nm in a planar direction are disposed on side faces along the entire circumferences of the second silicon pillar 5C and the third silicon pillar 5D. The second silicon pillar 5C, the fifth pillar side face S5, one of the gate electrodes 11a which are disposed with a gate insulating film interposed, and the first lower diffusion layer 9A construct the third transistor 50E. The third silicon pillar 5D, the sixth pillar side face S6, one of the gate electrodes 11a which are disposed with a gate insulating film interposed, and the second lower diffusion layer 9B construct the fourth transistor 50F.

Figure 8:
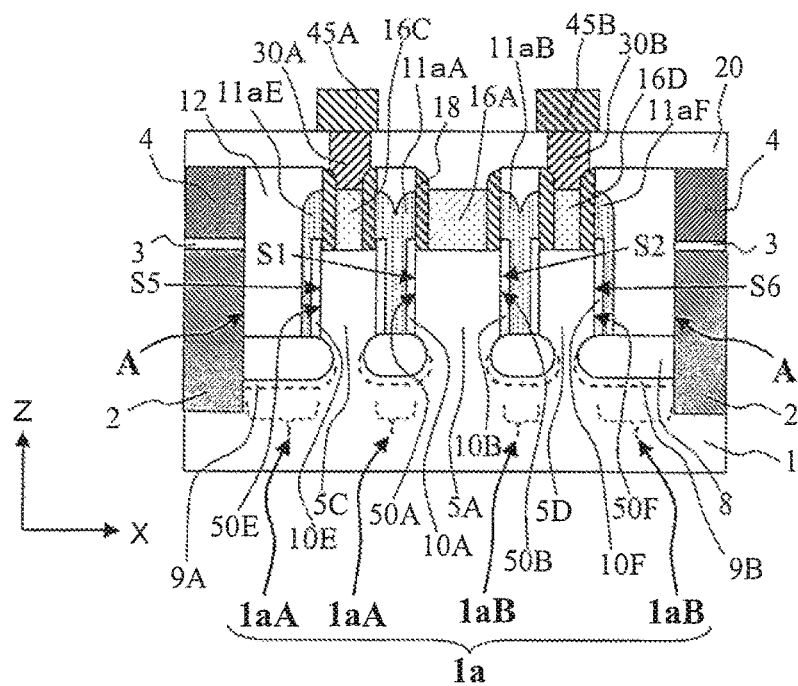
FIG. 8 is a sectional view taken along the line X-X' of FIG. 7.

Reference is made to a sectional view of FIG. 8 next. FIG. 8 is a sectional view taken along the line X-X of FIG. 7.

The first silicon pillar 5A, the second silicon pillar 5C, and the third silicon pillar 5D stand in the active region 1a which is a portion of the silicon substrate 1 that is surrounded by the STI region 2. The second silicon pillar 5C has the fifth pillar side face S5, and the third silicon pillar 5D has the sixth pillar side face S6. The third transistor 50E is disposed on the fifth pillar side face S5, and the fourth transistor 50F is disposed on the sixth pillar side face S6, In the third transistor 50E, a third gate electrode 11aE is formed on the fifth pillar side face S5 of the second silicon pillar 5C with a third gate insulating film 10E interposed between the gate electrode and the pillar side face. In the fourth transistor 50F, a fourth gate electrode 11aF is formed on the sixth pillar side face S6 of the third silicon pillar 5D with a fourth gate insulating film 10F interposed between the gate electrode and the pillar side face.

A gap between the first silicon pillar 5A and the second silicon pillar 5C, and a gap between the first silicon pillar 5A and the third silicon pillar 5D, are twice the thickness of each gate electrode 11a or less, which makes the first gate electrode 11aA and the third gate electrode 11aE unitary with each other, and the second gate electrode 11aB and the fourth gate electrode 11aF unitary with each other. With this configuration, each transistor is supplied with power by supplying power from the third plug 41 to the gate electrodes 11a of the second silicon pillar 5C and the third silicon pillar 5D via the dummy gate electrode 11b of the first dummy pillar 6a and the gate electrodes 11a of the first silicon pillar 5A.

The third transistor 50E has a second conductive layer 16C, which is located on a top face of the second silicon pillar 5C and which forms one of a source and a drain, and the first lower diffusion layer 9A, which is located below the second silicon pillar 5C and which forms the other of the source and the drain. Similarly, the fourth transistor 50F has a third conductive layer 16D, which is located on a top face of the third silicon pillar 5D and which forms one of a source and a drain, and the second lower diffusion layer 9B, which is located below the third silicon pillar 5D and which forms the other of the source and the drain.

The first lower diffusion layer 9A is placed below the first pillar side face S1 and the fifth pillar side face S5, and the second lower diffusion layer 9B is placed below the second pillar side face S2 and the sixth pillar side face S6. The vicinity of the surface of the fifth pillar side face S5 of the second silicon pillar 5C is a third channel region of the third transistor 50E. The vicinity of the surface of the sixth pillar side face S6 of the third silicon pillar 5D is a fourth channel region of the fourth transistor 50F. As described above, the third transistor 50E includes the first lower diffusion layer 9A in the first active region 1aA located below the fifth pillar side face S5 of the second silicon pillar 5C, the second conductive layer 16C located above the fifth pillar side face S5, the third gate insulating film 10E covering the fifth pillar side face S5, the third gate electrode 11aE covering the third gate insulating film 10E, and the third channel region located on a surface of the second silicon pillar 5C that constructs the fifth pillar side face S5.

The fourth transistor 50F includes the second lower diffusion layer 9B in the second active region 1aB located below the sixth pillar side face S6 of the third silicon pillar 5D, the third conductive layer 16D located above the sixth pillar side face S6, the fourth gate insulating film 10F covering the sixth pillar side face S6, the fourth gate electrode 11aF covering the fourth gate insulating film 10F, and the fourth channel region located on a surface of the third silicon pillar 5D that constructs the sixth pillar side face S6.

Thus, the first lower diffusion layer 9A is shared by the first transistor 50A and the third transistor 50E, and the second lower diffusion layer 9B is shared by the second transistor 50B and the fourth transistor 50F. In addition, the first conductive layer 16A is shared by the first transistor 50A and the second transistor 50B. The first transistor 50A, the second transistor 50B, the third transistor 50E, and the fourth transistor 50F are accordingly connected in series by the first conductive layer 16A, the first lower diffusion layer 9A, and the second lower diffusion layer 9B. The first plug 30A which pierces the second interlayer insulating film 20 is connected to the second conductive layer 16C in the first active region 1aA, and the second plug 30B which pierces the second interlayer insulating film 20 is connected to the third conductive layer 16D in the second active region 1aB.

The semiconductor device 300 according to the third exemplary embodiment can thus reduce the area taken up by the semiconductor device 300 as with the semiconductor device 100 according to the first exemplary embodiment. The semiconductor device 300 according to the third exemplary embodiment, where four transistors are connected in series by disposing three silicon pillars and two of the three silicon pillars are positioned so as to overlap with the first plug and the second plug, respectively, also has an advantage over the semiconductor device 200. In the semiconductor device 200, four transistors are connected in series by disposing two silicon pillars each having two transistors. The configuration of the semiconductor device 300 requires one less silicon pillar that has two transistors, and therefore takes up less area than the semiconductor device 200.

Fourth Exemplary Embodiment

A semiconductor device 400 according to a fourth exemplary embodiment of this invention is described next with reference to FIG. 9 and FIG. 10. The fourth exemplary embodiment is a modification of the first exemplary embodiment in which one new silicon pillar is additionally placed in the position where the first plug is disposed. In the fourth exemplary embodiment, components that have the same functions as those in the first embodiment are denoted by the same reference symbols in order to omit descriptions thereof and focus on differences from the first exemplary embodiment. A first silicon pillar 5A in the semiconductor device 300 is equivalent to the silicon pillar 5 in the semiconductor device 100. Similarly, a first conductive layer 16A is equivalent to the conductive layer 16.

Figure 9:
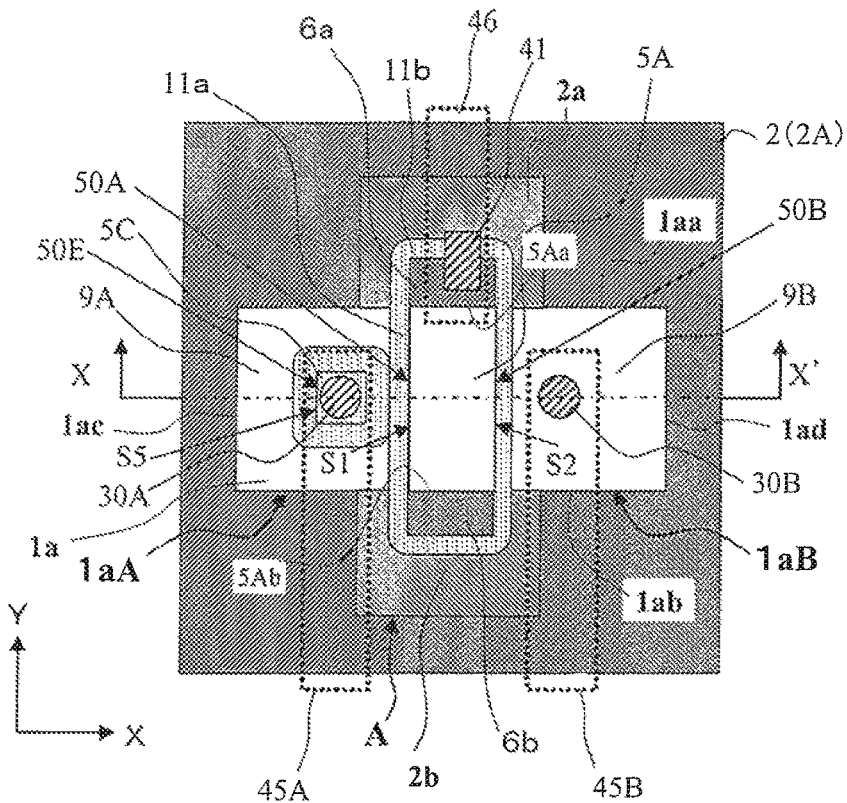
FIG. 9 is a schematic view (plan view) illustrating the structure of a semiconductor device 400 according to a fourth exemplary embodiment of this invention.

Reference is made to a plan view of FIG. 9 first. The active region 1a includes the first active region 1aA and the second active region 1aB, which are adjacent to each other in the direction X, the first silicon pillar 5A, which is located between the first active region 1aA and the second active region 1aB, and a second silicon pillar 5C, which is surrounded by the first active region 1aA, A third transistor 50E is disposed on a fifth pillar side face S5, which is the entirety of side faces of the second silicon pillar 5C. The first active region 1aA adjoining the first transistor 50A and the third transistor 50E is constructed from the first lower diffusion layer 9A, and the first plug 30A which serves as a contact plug is disposed on a top face of the third transistor 50E. The gate electrodes 11a having a thickness of 5 nm in a planar direction are disposed on side faces along the entire circumference of the second silicon pillar 5C. The second silicon pillar 5C, the fifth pillar side face S5, one of the gate electrodes 11a which are disposed with a gate insulating film interposed, and the first lower diffusion layer 9A construct the third transistor 50E.

Figure 10:
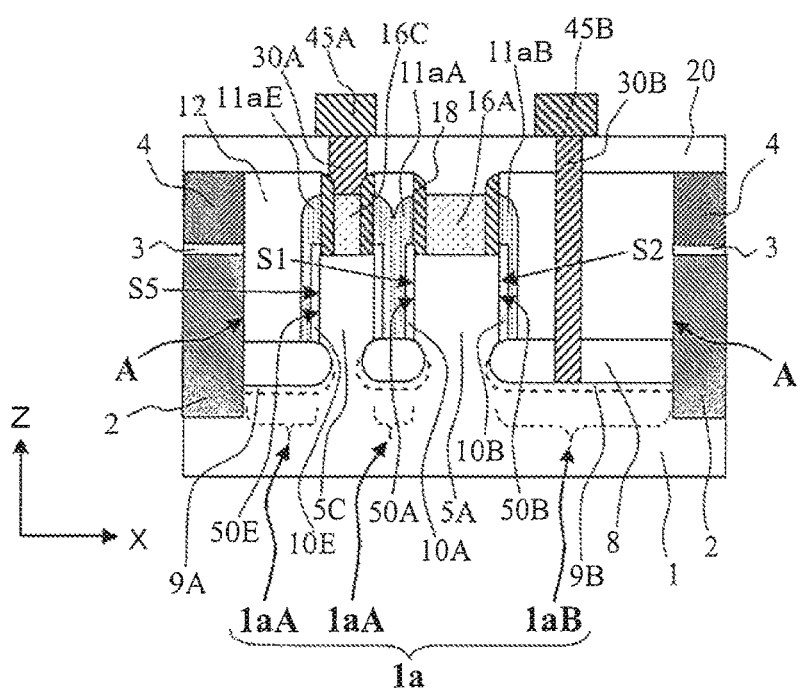
FIG. 10 is a sectional view taken along the line X-X' of FIG. 9.

Reference is made to a sectional view of FIG. 10 next. FIG. 10 is a sectional view taken along the line X-X' of FIG. 9. The first silicon pillar 5A and the second silicon pillar 5C stand in the active region 1a which is a portion of the silicon substrate 1 that is surrounded by the STI region 2. The second silicon pillar 5C has the fifth pillar side face S5. The third transistor 50E is disposed on the fifth pillar side face S5. In the third transistor 50E, a third gate electrode 11aE is formed on the fifth pillar side face S5 of the second silicon pillar 5C with a third gate insulating film 10E interposed between the gate electrode and the pillar side face. A gap between the first silicon pillar 5A and the second silicon pillar 5C is twice the thickness of each gate electrode 11a or less, and the first gate electrode 11aA and the third gate electrode 11aE are therefore unitary with each other. With this configuration, each transistor is supplied with power by supplying power from the third plug 41 to the gate electrodes 11a of the second silicon pillar 5C via the dummy gate electrode 11b of the first dummy pillar 6a and the gate electrodes 11a of the first silicon pillar 5A.

The third transistor 50E has the second conductive layer 16C, which is located on a top face of the second silicon pillar 5C and which forms one of a source and a drain, and the first lower diffusion layer 9A, which is located below the second silicon pillar 5C and which forms the other of the source and the drain. The first lower diffusion layer 9A is placed below the first pillar side face S1 and the fifth pillar side face S5. The vicinity of the surface of the fifth pillar side face S5 of the second silicon pillar 5C is a third channel region of the third transistor 50E. As described above, the third transistor 50E includes the first lower diffusion layer 9A in the first active region 1aA located below the fifth pillar side face S5 of the second silicon pillar 5C, the second conductive layer 16C located above the fifth pillar side face S5, the third gate insulating film 10E covering the fifth pillar side face S5, the third gate electrode 11aE covering the third gate insulating film 10E, and the third channel region located on a surface of the second silicon pillar 5C that constructs the fifth pillar side face S5.

Thus, the first lower diffusion layer 9A is shared by the first transistor 50A and the third transistor 50E, and the first conductive layer 16A is shared by the first transistor 50A and the second transistor 50B. The first transistor 50A, the second transistor 50B, and the third transistor 50E are accordingly connected in series by the first conductive layer 16A and the first lower diffusion layer 9A. The first plug 30A which pierces the second interlayer insulating film 20 is connected to the second conductive layer 16C in the first active region 1aA.

The semiconductor device 400 according to the fourth exemplary embodiment can thus reduce the area taken up by the semiconductor device 400 as with the semiconductor device 100 according to the first exemplary embodiment. The semiconductor device 400 according to the fourth exemplary embodiment, where three transistors are connected in series by disposing two silicon pillars and one of the two silicon pillars is positioned so as to overlap with the first plug, also has an advantage over the first to third embodiments. In the first to third embodiments, two or four transistors are connected in series so as to build a semiconductor apparatus that has high withstand voltage characteristics equivalent to an even multiple of the withstand voltage characteristics of a single transistor. The semiconductor device 400, on the other hand, can build a semiconductor device that has high withstand voltage characteristics equivalent to an odd multiple of the withstand voltage characteristics of a single transistor while taking up the same area as in the first embodiment.

(Method of Manufacturing the Semiconductor Device According to the First Exemplary Embodiment)

A method of manufacturing the semiconductor device 100 according to the first exemplary embodiment is described next in detail with reference to FIGS. 11 to 26. The semiconductor device 200 according to the second exemplary embodiment, the semiconductor device 300 according to the third exemplary embodiment, and the semiconductor device 400 according to the fourth exemplary embodiment can readily be formed by changing the shape of an opening in a photoresist mask of the semiconductor device 100 which is described later, and descriptions on manufacturing methods thereof are therefore omitted.

Figure 11:
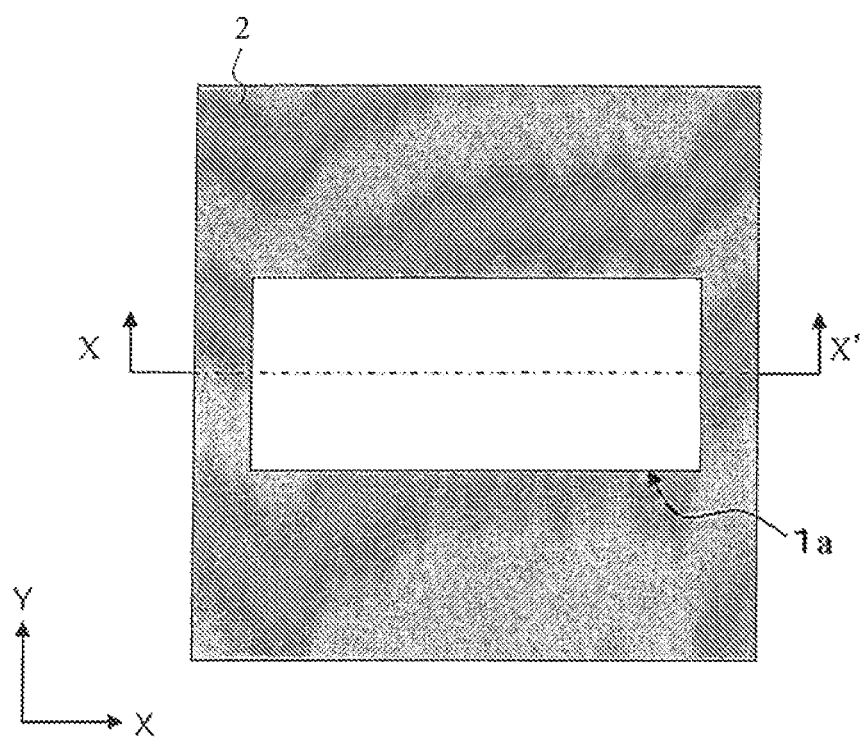
FIG. 11 is a diagram (plan view) illustrating a method of manufacturing the semiconductor device 100 according to the first exemplary embodiment.
Figure 12:
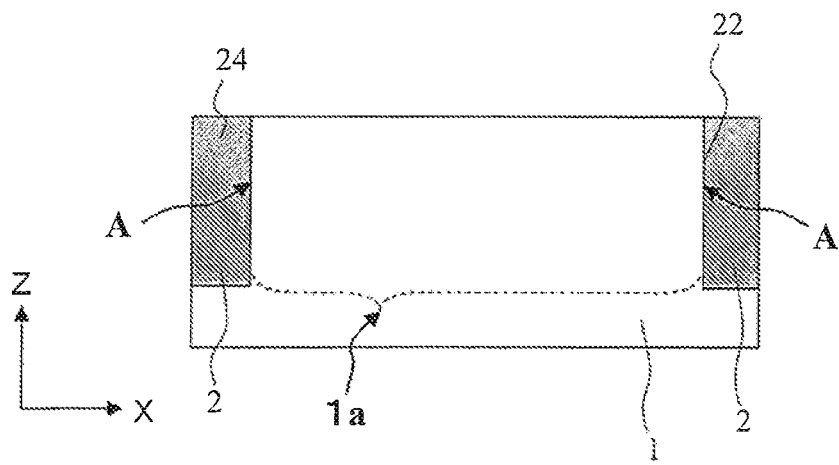
FIG. 12 is a sectional view taken along the line X-X' of FIG. 11.

First, a trench 22 is formed in the silicon substrate 1 by photolithography and dry etching as illustrated in FIGS. 11 and 12. The depth of the trench 22 is, for example, 250 nm.

Next, an insulating film 24 which is a silicon nitride film or a silicon oxide film is deposited on the entire surface of the silicon substrate 1 by chemical vapor deposition (CVD) so as to fill up the trench 22. Unnecessary portions of the insulating film 24 formed on the top face of the silicon substrate 1 are then removed by chemical mechanical polishing (CMP), thereby leaving the insulating film 24 only in the trench 22 and forming the STI region 2 which forms a device isolation region. The active region 1a surrounded by the STI region 2 is thus formed.

Figure 13:
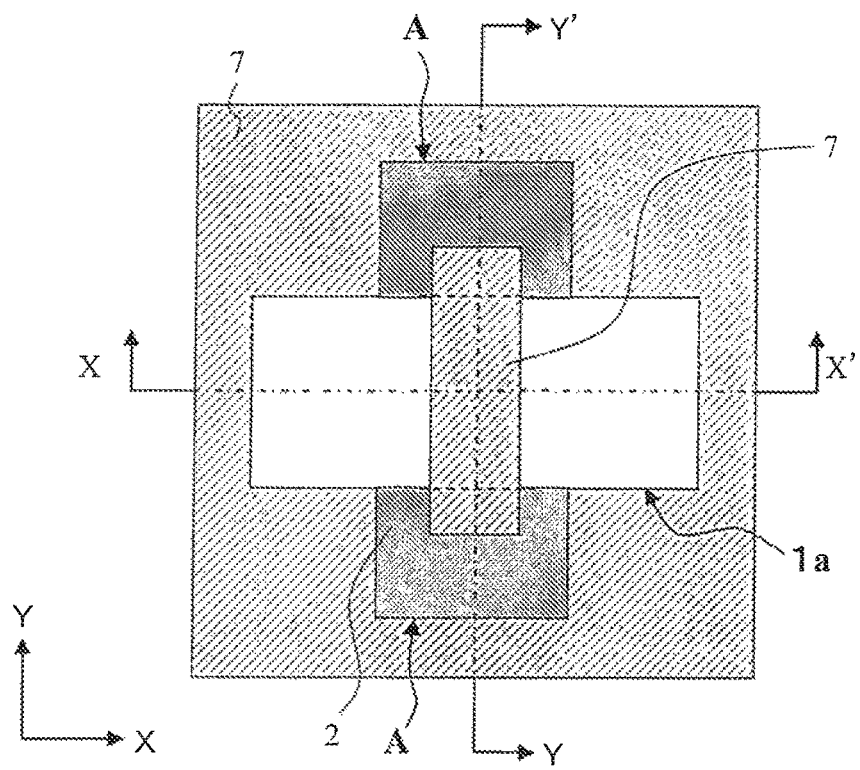
FIG. 13 is a diagram (plan view) illustrating the method of manufacturing the semiconductor device 100 according to the first exemplary embodiment.
Figure 14:
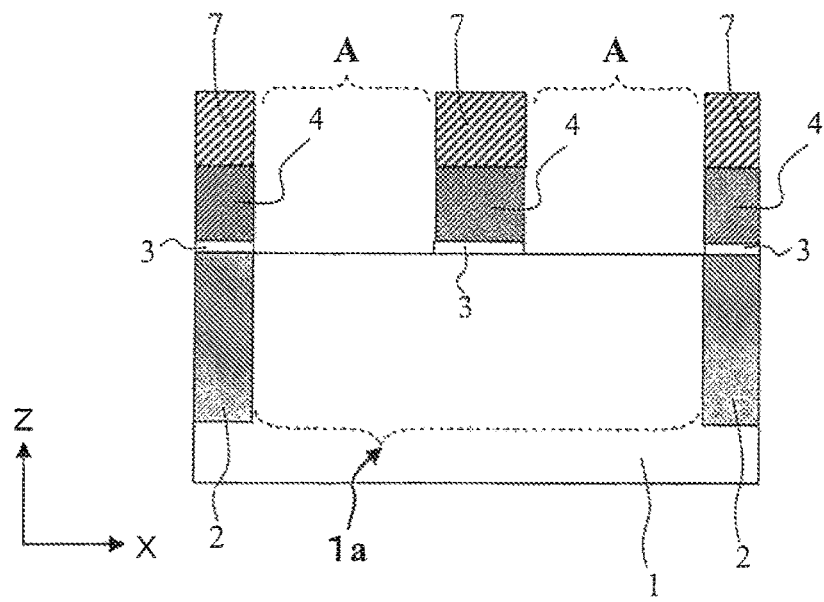
FIG. 14 is a sectional view taken along the line X-X' of FIG. 13.
Figure 15:
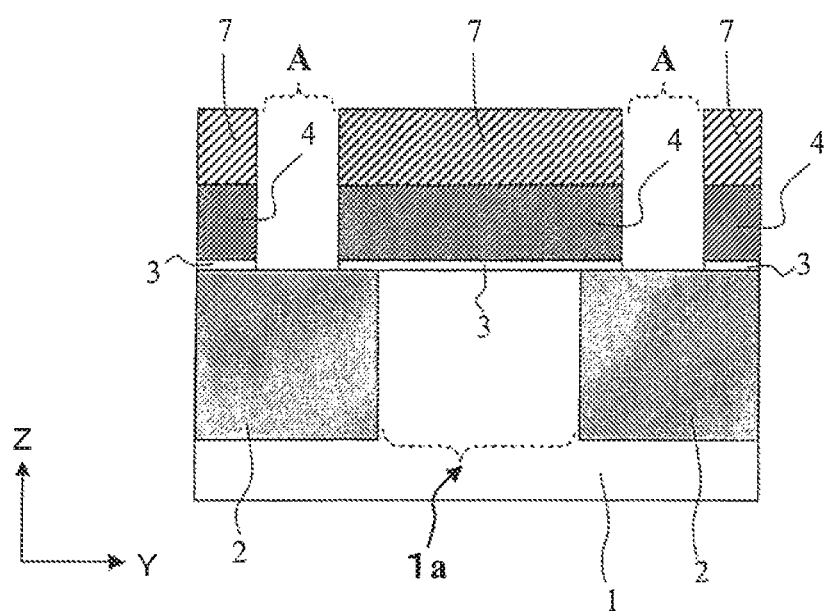
FIG. 15 is a sectional view taken along the line Y-Y' of FIG. 13.

Next, an insulating film 3 which is a silicon oxide film is formed by CVD on the top face of the silicon substrate 1 to a thickness of 2 nm as illustrated in FIGS. 13 to 15. A mask film 4 which is a silicon nitride film is then formed to a thickness of 120 nm.

A photoresist mask 7 having the pattern of the pillar trench forming region A is formed next by photolithography on the top face of the mask film 4. The pillar trench forming region A is a region that precedes the forming of the silicon pillar 5 and, after the silicon pillar 5 is formed, the same name is used to refer to the region where the silicon pillar 5 has been dug up. The photoresist mask 7 may include a hard mask such as an amorphous carbon film. In the photoresist mask 7, a pattern corresponding to the silicon pillar and a pattern corresponding to the dummy pillars adjacent to the active region 1a are formed at the same time the pattern of the pillar trench forming region A is formed. The pattern corresponding to the silicon pillar has a rectangular shape that is 45 nm in width in the direction X. The pattern corresponding to the dummy pillars can have an arbitrary size, and does not need to be of the same size as the silicon pillar.

Next, the patterns are transferred to the mask film 4 and the insulating film 3 by anisotropic dry etching with the use of the photoresist mask 7. This exposes the top face of the silicon substrate 1 and the top face of the STI region 2 inside the patterned opening (which corresponds to the pillar trench forming region A). The photoresist mask 7 is then removed.

Figure 16:
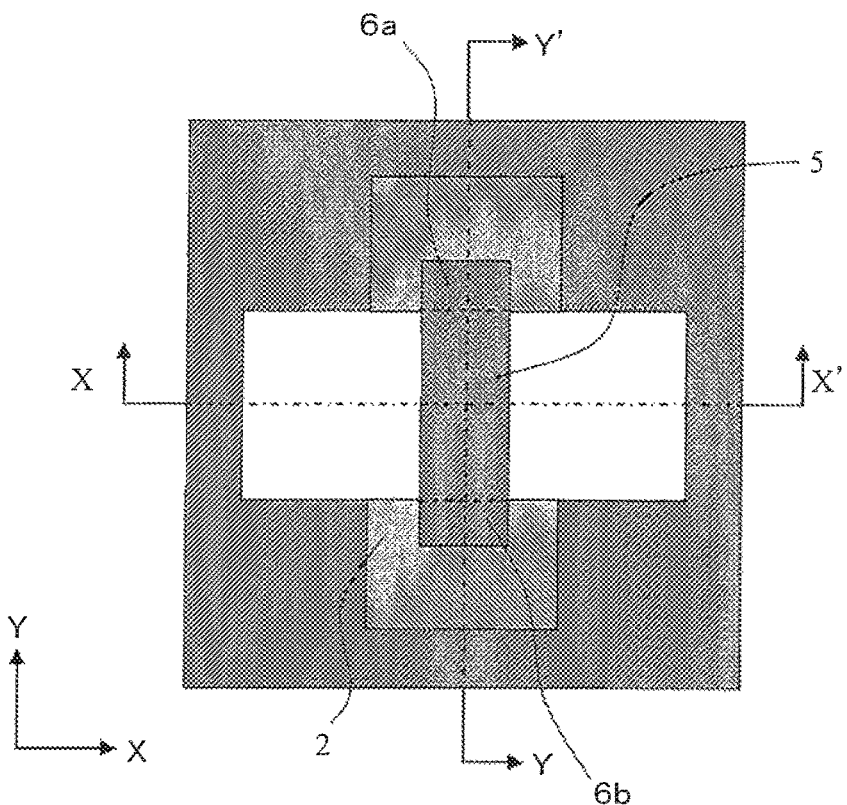
FIG. 16 is a diagram (plan view) illustrating the method of manufacturing the semiconductor device 100 according to the first exemplary embodiment.
Figure 17:
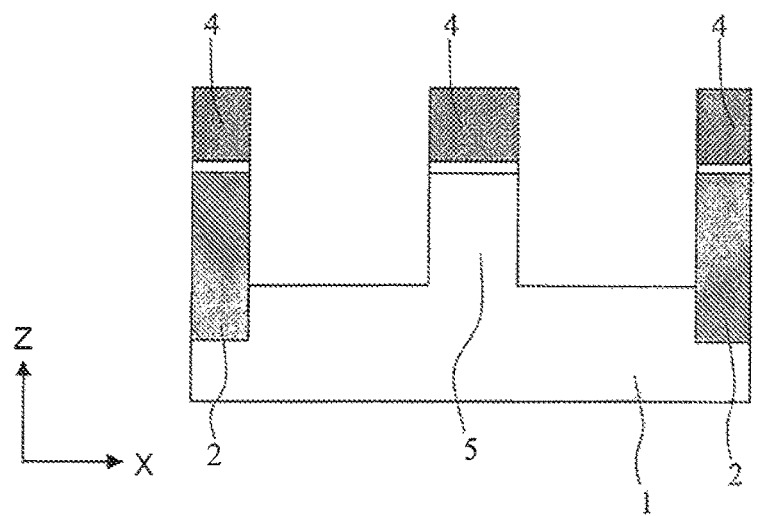
FIG. 17 is a sectional view taken along the line X-X' of FIG. 16.
Figure 18:
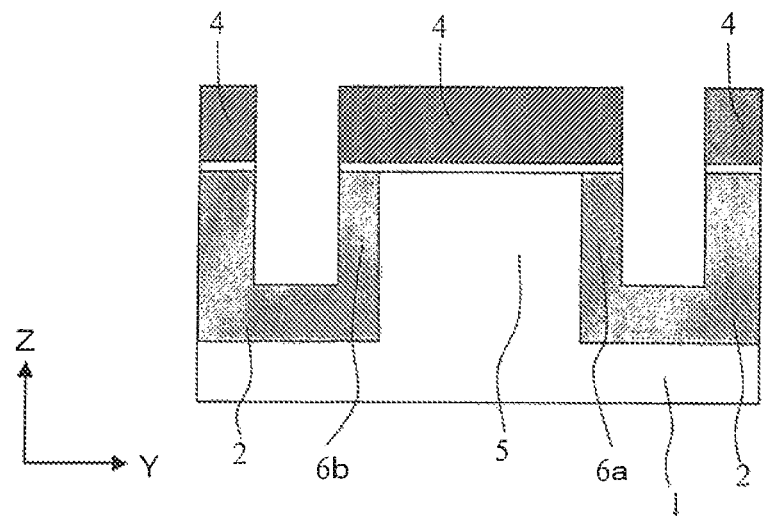
FIG. 18 is a sectional view taken along the line Y-Y' of FIG. 16.

Next, as illustrated in FIGS. 16 to 18, the exposed silicon substrate 1 and the STI region 2 are dug down by anisotropic dry etching with the mask film 4 as a mask until the depth of the silicon substrate 1 and the STI region 2 is 150 nm, to thereby form one silicon pillar 5 and two dummy pillars 6 (6a and 6b). The silicon pillar 5 is formed so as to protrude upward from the top face of the silicon substrate 1 dug down. The dummy pillars 6 are formed so as to protrude upward from the top face of the STI region 2 dug down. This gives the silicon pillar 5 a rectangular shape that is 45 nm in width in the direction X. The two dummy pillars are respectively formed in contact with two side faces in the direction Y of the silicon pillar 5 as illustrated in FIG. 18. With the width in the direction X of the silicon pillar 5 set to 45 nm, depletion layers and a neutral region which are generated by the first transistor and the second transistor can be kept stable.

Figure 19:
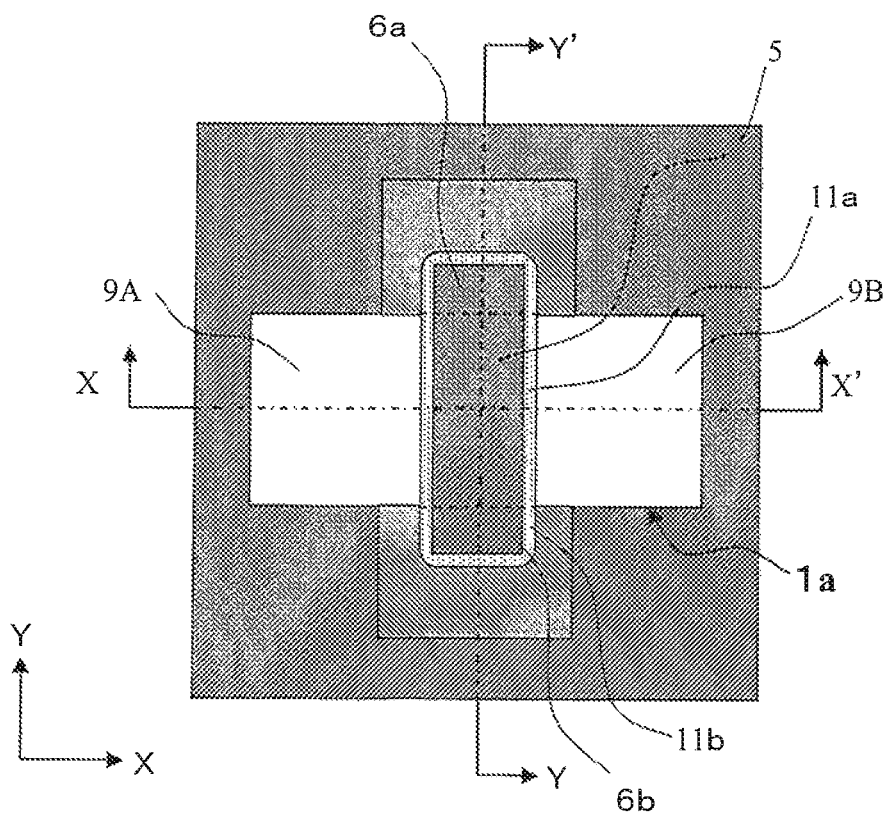
FIG. 19 is a diagram (plan view) illustrating the method of manufacturing the semiconductor device 100 according to the first exemplary embodiment.
Figure 20:
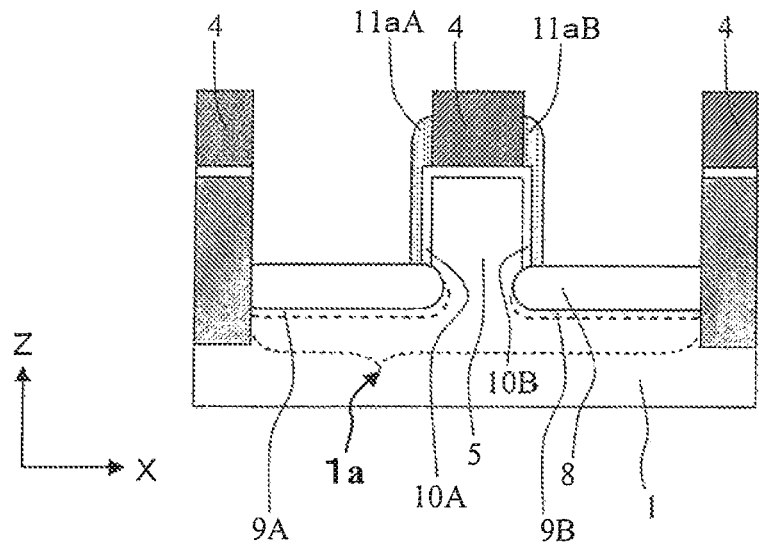
FIG. 20 is a sectional view taken along the line X-X of FIG. 19.
Figure 21:
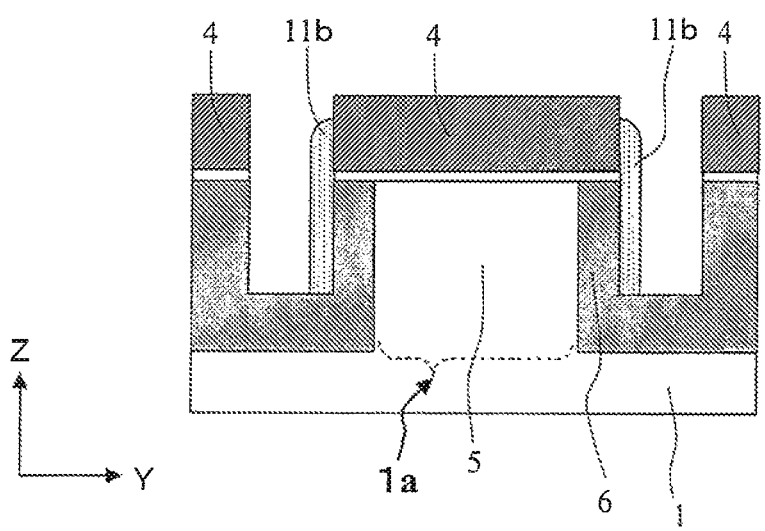
FIG. 21 is a sectional view taken along the line Y-Y' of FIG. 19.

Next, an oxide film (not shown) having a thickness of 5 nm is formed on the side faces of the silicon pillar 5 by thermal oxidation as illustrated in FIGS. 19 to 21. A silicon nitride film is further formed to a thickness of 20 nm by CVD, and then blanket etch back is performed to form a side wall film (not shown) on the side faces of the silicon pillar 5, the dummy pillars 6, and the mask film 4.

Next, the insulating film 8 which is a silicon oxide film having a thickness of 30 nm is formed by thermal oxidation in a portion of the active region 1a that is exposed around the silicon pillar 5. The side faces of the silicon pillar 5 are covered with the side wall film which is a silicon nitride film and are therefore not oxidized in this step.

Next, the lower diffusion layers 9 (9a and 9b) are formed below the insulating film 8 by ion implantation. The first lower diffusion layer 9A and the second lower diffusion layer 9B are separated from each other by the silicon pillar 5. In the case of an N-type transistor, arsenic can be used as an impurity to be implanted.

Next, the side wall film formed on the side faces of the silicon pillar 5 and of the dummy pillars 6 and the oxide film are removed by dry etching or wet etching. The gate insulating films 10 (10A, and 10B) which are silicon oxide films each having a thickness of 3 nm are formed next by thermal oxidation on the side faces of the silicon pillar 5.

Next, a polysilicon film (polycrystalline silicon film) for forming gate electrodes is formed by CVD to a thickness of 20 nm on the entire surface of the silicon substrate 1, and then blanket etch back is performed. Through this treatment, the gate electrodes 11a (11aA and 11aB) are formed on the side faces of the silicon pillar 5, and the dummy gate electrode 11b is formed on the side faces of the dummy pillars 6 as well. Here, the dummy gate electrode 11b on the side faces of the dummy pillars 6 is connected to the gate electrodes 11a on the side faces of the silicon pillar 5 as illustrated in FIG. 19. In the case where the gate electrode wiring 11 is formed on the side faces of the silicon pillar 5 and of the dummy pillars 6, the gate electrode wiring 11 (not shown) is also formed on side faces of the STI region 2.

Figure 22:
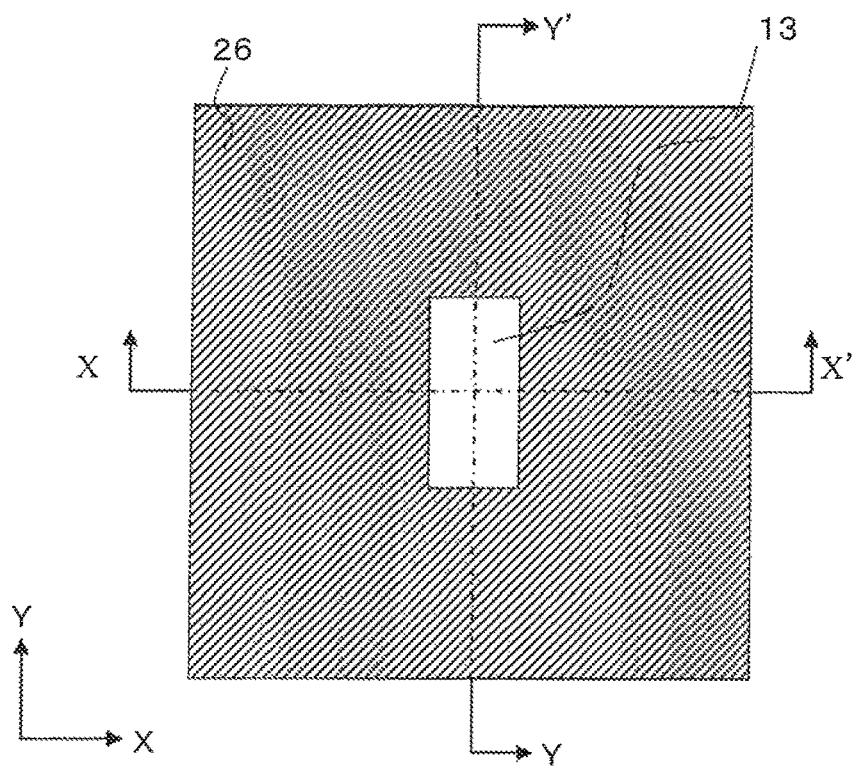
FIG. 22 is a diagram (plan view) illustrating the method of manufacturing the semiconductor device 100 according to the first exemplary embodiment.
Figure 23:
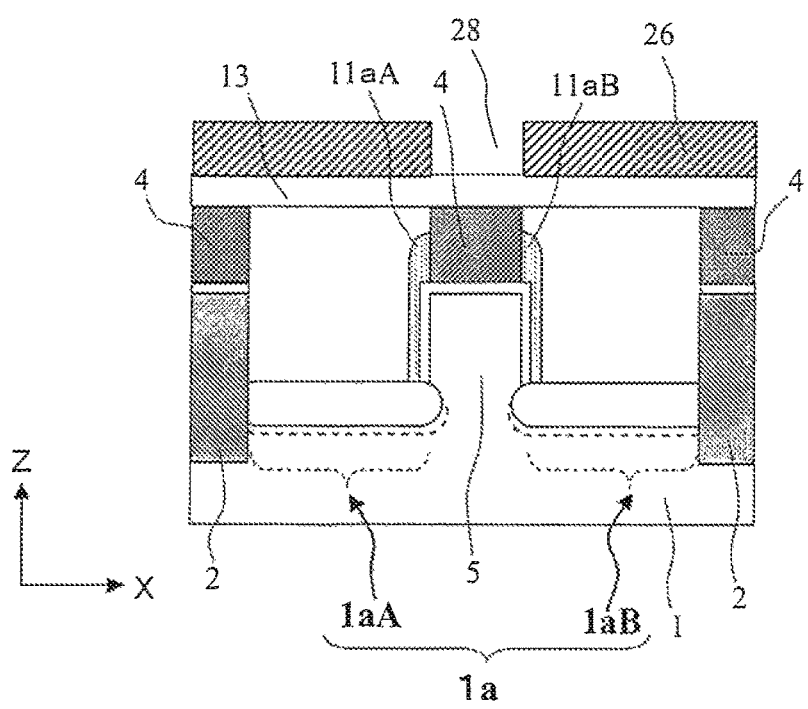
FIG. 23 is a sectional view taken along the line X-X' of FIG. 22.
Figure 24:
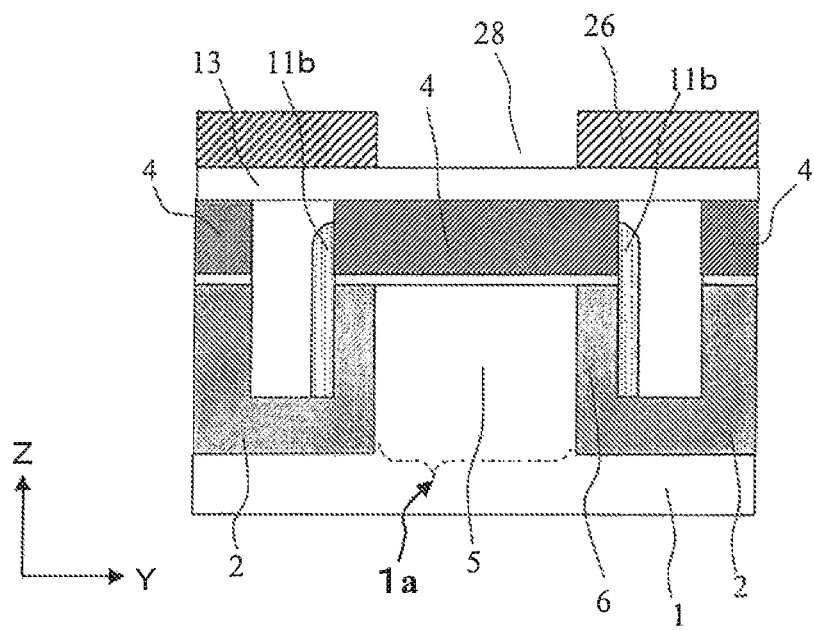
FIG. 24 is a sectional view taken along the line Y-Y' of FIG. 22.

Next, the first interlayer insulating film 12 which is a silicon oxide film is formed by CVD so as to bury the silicon pillar 5 and the dummy pillars 6 as illustrated in FIGS. 22 to 24. The first interlayer insulating film 12 is then leveled by CMP so that the mask film 4 is exposed, and a mask film 13 which is a silicon oxide film is subsequently formed by CVD to a thickness of 50 nm. Next, a photoresist mask 26 is formed by photolithography on the top face of the mask film 13. The photoresist mask 26 has an opening 28 for exposing only a portion of the mask film 13 that is above the silicon pillar 5, and covers portions of the mask film 13 that are above the first active region 1aA and the second active region 1aB and above the STI region 2.

Figure 25:
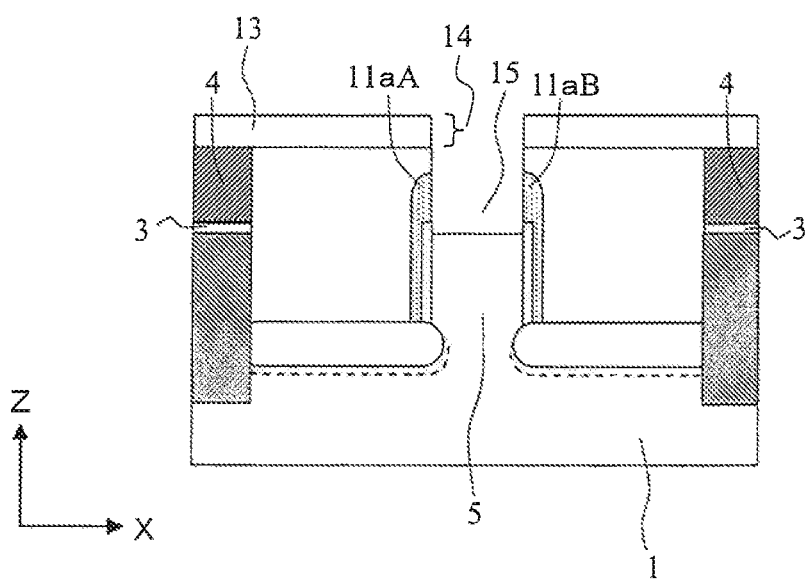
FIG. 25 is a diagram (sectional view along the line X-X') illustrating the method of manufacturing the semiconductor device 100 according to the first exemplary embodiment.

Next, the exposed portion of the mask film 13 is removed by anisotropic dry etching as illustrated in FIG. 25. In an opening 14 where the mask film 13 has been removed, a portion of the mask film 4 that is above the silicon pillar 5 is exposed. The exposed portion of the mask film 4 is then removed by anisotropic dry etching, and a portion of the insulating film 3 that has been a base of the removed portion of the mask film 4 is further removed, to thereby form an opening 15 above the silicon pillar 5. The top face of the silicon pillar 5 is exposed at the bottom of the opening 15, and the gate electrodes 11a are partially exposed along the side faces of the opening 15.

Figure 26:
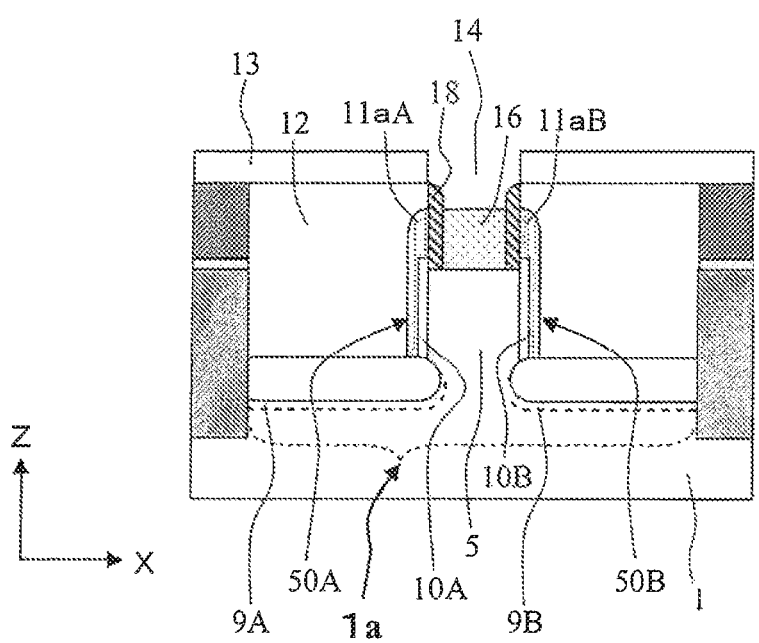
FIG. 26 is a diagram (sectional view along the line X-X') illustrating the method of manufacturing the semiconductor device 100 according to the first exemplary embodiment.

Next, an insulating film (not shown) which is a silicon oxide film is formed on the inner wall of the opening 15 by thermal oxidation. A silicon nitride film is formed next by CVD to a thickness of 10 nm and then etch back is performed to form the side wall insulating film 18 which is a silicon nitride film on the inner wall of the opening 15 as illustrated in FIG. 26. At the time the side wall insulating film 18 is formed, the insulating film (not shown) which has been formed on the top face of the silicon pillar 5 is removed to expose the top face of the silicon pillar 5. The side wall insulating film 18 has the role of ensuring insulation between a subsequently formed conductive layer and the gate electrodes 11a.

Next, the conductive layer 16 made of silicon is grown on the top face of the silicon pillar 5 by selective epitaxial growth. The top face of the conductive layer 16 at this point is positioned below the top face of the first interlayer insulating film 12. Thereafter, arsenic, in the case of an N-type transistor, or other impurities are implanted by ion implantation, to thereby bring the conductive layer 16 as an n-type conductor into electrical contact with the top of the silicon pillar 5. The implanted arsenic or other impurities may be diffused in the top of the silicon pillar 5, and regions where the impurities are diffused may function as sources or drains of the transistors. At this point, the first transistor 50A including the first lower diffusion layer 9A, the conductive layer 16, the first gate insulating film 10A, and the first gate electrode 11aA is formed on one of the side faces in the direction X of the silicon pillar 5.

Similarly, the second transistor 50B including the second lower diffusion layer 9B, the conductive layer 16, the second gate insulating film 10B, and the second gate electrode 11aB is formed on the other of the side faces in the direction X of the silicon pillar 5. The conductive layer 16 is connected to the first transistor 50A and the second transistor 50B and, as described above, the depletion layers and the neutral region in the first transistor 50A and the second transistor 50B are generated stably in the silicon pillar 5. The first transistor 50A and the second transistor 50B are accordingly connected in series.

Next, the second interlayer insulating film 20 which is a silicon oxide film is formed by CVD so as to fill up the opening 14 as illustrated in FIGS. 1 to 3. The second interlayer insulating film 20 becomes unitary with the mask film 13 and, in the following description, the mask film 13 is treated as being included in the second interlayer insulating film 20. Next, the second interlayer insulating film 20 is leveled by CMP. The leveling leaves the second interlayer insulating film 20 on the top face of the conductive layer 16. Next, the first plug 30A, the second plug 30B, and the third plug 41 are formed by a known manufacturing method. The first wiring 45A, the second wiring 45B, and the third wiring 46 are then formed, whereby completing the semiconductor device 100.

The invention made by the inventors has been described based upon some exemplary embodiments. However, the present invention is not limited to the aforementioned exemplary embodiments. It would be apparent to those skilled in the art that many modifications and variations may be made therein without departing from the spirit and scope of the present invention.

What is claimed is:
1. A semiconductor device, comprising:
an active region which is surrounded by a device isolation region on a semiconductor substrate and which extends in a first direction;
a silicon pillar which separates the active region along the first direction into a first lower diffusion layer and a second lower diffusion layer, the first lower diffusion layer and the second lower diffusion layer being physically separated from each other in all horizontal cross-sections through both of the first lower diffusion layer and the second lower diffusion within the semiconductor substrate or within the silicon pillar, the silicon pillar having a first pair of opposing sidewall surfaces consisting of a first sidewall surface and a second sidewalls surface spaced from each other along the first direction, and having a second pair of opposing sidewalls surfaces consisting of a third sidewall surface and a fourth sidewalls surface spaced from each other along a second direction;
a first gate electrode comprising an electrode material covering the first sidewalls surface of the silicon pillar which is located on a side of the first lower diffusion layer;
a second gate electrode comprising the electrode material covering the second sidewall surface of the silicon pillar which is located on a side of the second lower diffusion layer;
a gate dielectric material between the gate electrodes and the first and second sidewalls;
a conductive layer provided on a top face of the silicon pillar, the conductive layer having a top surface, an insulating material being directly against an entirety of the top surface of the conductive layer; and
a first isolation pillar comprising a device isolation insulating film in direct physical contact with the third sidewall surface, the device isolation film being distinct from the gate insulating material, and a second isola- tion pillar comprising the device isolation film in direct physical contact with the fourth sidewall surface.

2. A semiconductor device, comprising:
an active region which is surrounded by a device isolation region on a semiconductor substrate and which extends in a first direction;
a silicon pillar which separates the active region along the first direction into a first lower diffusion layer and a second lower diffusion layer, the first lower diffusion layer and the second lower diffusion layer being physically separated from each other in every horizontal cross-section through both of the first lower diffusion layer and the second lower diffusion layer within the semiconductor substrate or within the silicon pillar;
a first gate electrode covering a first sidewall of the silicon pillar which is located on a side of the first lower diffusion layer;
a second gate electrode covering a second sidewall of the silicon pillar which is located on a side of the second lower diffusion layer;
a conductive layer provided on a top face of the silicon pillar, the conductive layer having a top surface, an insulating material being directly against an entirety of the top surface of the conductive layer; and
a pair of opposing isolation pillars comprising device isolation insulating film material, a first of the isolation pillars in direct physical contact with a third sidewall of the silicon pillar, and a second of the isolation pillars in direct physical contact with a fourth sidewall of the silicon pillar; and
further comprising:
a first channel region located on the sidewall face of the silicon pillar which is disposed between the conductive layer and the first lower diffusion layer;
a first gate insulating film provided between the first channel region and the first gate electrode, the first gate insulating film being distinct from the insulating film material;
a second channel region located on the second sidewall of the silicon pillar which is disposed between the conductive layer and the second lower diffusion layer; and
a second gate insulating film provided between the second channel region and the second gate electrode,
wherein the first lower diffusion layer, the first gate electrode, the first channel region, and the conductive layer construct one transistor,
wherein the second lower diffusion layer, the second gate electrode, the second channel region, and the conductive layer construct another transistor, and
wherein the one and another transistors are connected in series via the conductive layer.

3. A semiconductor device according to claim 2, wherein the conductive layer forms a first source/drain region that is shared by the one transistor and the another transistor, and
wherein the first lower diffusion layer forms a second source/drain region in the one transistor, and the second lower diffusion layer forms a third source/drain region in the another transistor.

4. A semiconductor device according to claim 1, further comprising:
an insulating film provided above the first lower diffusion layer and the second lower diffusion layer to extend in the first direction and to reach the device isolation region,
wherein the insulating film electrically insulates the first lower diffusion layer from the first gate electrode, and electrically insulates the second lower diffusion layer from the second gate electrode.

5. A semiconductor device according to claim 1, wherein the device isolation region is arranged to reach a deeper position than the first lower diffusion layer and the second lower diffusion layer when viewed from the top face of the silicon pillar.

6. A semiconductor device according to claim 2, further comprising:
a side wall insulating film covering side faces of the conductive layer,
wherein the first channel region and the first gate electrode are electrically insulated by the first gate insulating film and the side wall insulating film,
wherein the second channel region and the second gate electrode are electrically insulated by the second gate insulating film and the side wall insulating film, and
wherein the conductive layer and each of the first gate electrode and the second gate electrode are electrically insulated by the side wall insulating film and each of the first gate insulating film and the second gate insulating film.

7. A semiconductor device according to claim 1, further comprising:
a first wiring and a second wiring provided on a top face of the semiconductor substrate,
wherein the first wiring is connected to the first lower diffusion layer by a first plug and the second wiring is connected to the second lower diffusion layer by a second plug that is different from the first plug.

8. A semiconductor device according to claim 1, wherein the silicon pillar comprises a portion of the semiconductor substrate that extends along a length of the active region in a second direction orthogonal to the first direction.

9. A semiconductor device according to claim 8, wherein a width in the second direction of the silicon pillar is equal to a width in the second direction of the active region.

10. A semiconductor device according to claim 1, further comprising:
a dummy gate electrode material on side faces of the first and second isolation pillars and extending continuously from the first gate electrode on the first sidewall and the second gate electrode on the second sidewall.

11. A semiconductor device according to claim 10, wherein the first gate electrode and the second gate electrode are supplied with a gate voltage through the dummy gate electrode provided along the external circumferences of the isolation pillars.

12. A semiconductor device, comprising:
an active region which is surrounded by a device isolation region on a semiconductor substrate and which extends in a first direction;
a silicon pillar which separates the active region along the first direction into a first lower diffusion layer and a second lower diffusion layer, the first lower diffusion layer and the second lower diffusion layer being physically separated from each other in all horizontal cross-sections through both of the first lower diffusion layer and the second lower diffusion within the semiconductor substrate or within the silicon pillar, the silicon pillar having a first pair of opposing sidewall surfaces consisting of a first sidewall surface and a second sidewalls surface spaced from each other along the first direction, and having a second pair of opposing sidewalls surfaces consisting of a third sidewall surface and a fourth sidewalls surface spaced from each other along a second direction;

a first gate electrode comprising an electrode material covering the first sidewalls surface of the silicon pillar which is located on a side of the first lower diffusion layer;
a second gate electrode comprising the electrode material covering the second sidewall surface of the silicon pillar which is located on a side of the second lower diffusion layer;
a gate dielectric material between the gate electrodes and the first and second sidewalls;
a conductive layer provided on a top face of the silicon pillar; and
a first isolation pillar comprising a device isolation insulating film in direct physical contact with the third sidewall surface, the device isolation film being distinct from the gate insulating material, and a second isolation pillar comprising the device isolation film in direct physical contact with the fourth sidewall surface, the electrode material being in contact with an outer sidewall surface of the first and second isolation pillars, the electrode material and the isolation pillars forming dummy pillars, each of the dummy pillars having a width in the second direction that matches a thicker one of a thickness of the first gate insulating film and a thickness of the second gate insulating film when viewed in the first direction.

13. A semiconductor device, comprising:
an active region which is surrounded by a device isolation region on a semiconductor substrate and which extends in a first direction;
a silicon pillar which separates the active region along the first direction into a first lower diffusion layer and a second lower diffusion layer;
a first gate electrode covering a first side face of the silicon pillar which is located on a side of the first lower diffusion layer;
a second gate electrode covering a second side face of the silicon pillar which is located on a side of the second lower diffusion layer;
a conductive layer provided on a top face of the silicon pillar, the conductive layer having a top, insulating material being directly against all of the top of the conductive layer; and
a device isolation insulating film in direct physical contact with a third side face of the silicon pillar which is different from the first side face and the second side face; and
further comprising:
a first channel region located on the first side face of the silicon pillar which is disposed between the conductive layer and the first lower diffusion layer;
a first gate insulating film provided between the first channel region and the first gate electrode;
a second channel region located on the second side face of the silicon pillar which is disposed between the conductive layer and the second lower diffusion layer; and
a second gate insulating film provided between the second channel region and the second gate electrode,
wherein the first lower diffusion layer, the first gate electrode, the first channel region, and the conductive layer construct one transistor,
wherein the second lower diffusion layer, the second gate electrode, the second channel region, and the conductive layer construct another transistor, and
wherein the one and another transistors are connected in series via the conductive layer.

14. The semiconductor device of claim 13 the conductive layer constructs one of a source and a drain in each of the one transistor and the another transistor and that is shared by the one transistor and the another transistor, and
wherein the first lower diffusion layer constructs another of the source and the drain in the one transistor, and the second lower diffusion layer constructs another of the source and the drain in the another transistor.

15. A semiconductor device, comprising:
an active region which is surrounded by a device isolation region on a semiconductor substrate and which extends in a first direction;
a silicon pillar which separates the active region along the first direction into a first lower diffusion layer and a second lower diffusion layer, the silicon pillar being more elongated in a first horizontal direction relative to a second horizontal direction;
a first gate electrode covering a first side face of the silicon pillar which is located on a side of the first lower diffusion layer;
a second gate electrode covering a second side face of the silicon pillar which is located on a side of the second lower diffusion layer, the first side face and second side faced being spaced from one another along the first direction;
a gate insulating material between the first gate electrode and the pillar and between the second gate electrode and the pillar;
a conductive layer provided on a top face of the silicon pillar, the conductive layer having a top surface, an insulating material being directly against an entirety of the top surface of the conductive layer; and
a device isolation insulating film in direct physical contact with a third side face of the silicon pillar, the third side face extending along the first direction between the first and second side faces, the device isolation film being distinct from the gate insulating material.

16. The semiconductor device of claim 15 wherein the first horizontal direction is orthogonal to the and second horizontal direction.

17. The semiconductor device of claim 15 wherein the active region extends and is elongated in the one horizontal direction.

18. A semiconductor device, comprising:
an active region which is surrounded by a device isolation region on a semiconductor substrate and which extends in a first direction;
a silicon pillar which separates the active region along the first direction into a first lower diffusion layer and a second lower diffusion layer, the silicon pillar having a quadrilateral shape in horizontal cross-section;
a first gate electrode covering a first sidewall of the silicon pillar which is located on a side of the first lower diffusion layer;
a second gate electrode covering a second sidewall of the silicon pillar which is located on a side of the second lower diffusion layer, the first and second sidewalls opposing each other along the first direction;
a gate dielectric material between each of the first and second gates and the silicon pillar;
a conductive layer provided on a top face of the silicon pillar, the conductive layer having a top surface, an insulating material being directly against an entirety of the top surface of the conductive layer; and
a device isolation insulating film in direct physical contact with a third side face of the silicon pillar, the third sidewall extending along the first direction between the first and second sidewalls, the device isolation insulating film being distinct from the gate dielectric material.

19. The semiconductor device of claim 18 wherein the quadrilateral shape is a rectangle.

* * * * *